United States Patent [19]
Thompson et al.

[11] Patent Number: 5,174,045
[45] Date of Patent: Dec. 29, 1992

[54] SEMICONDUCTOR PROCESSOR WITH EXTENDIBLE RECEIVER FOR HANDLING MULTIPLE DISCRETE WAFERS WITHOUT WAFER CARRIERS

[75] Inventors: Raymon F. Thompson; Aleksander Owczarz, both of Kalispell, Mont.

[73] Assignee: Semitool, Inc., Kalispell, Mont.

[21] Appl. No.: 703,266

[22] Filed: May 17, 1991

[51] Int. Cl.⁵ .................................. F26B 17/24
[52] U.S. Cl. .................................. 34/58; 34/8; 34/184; 210/360.1
[58] Field of Search .............. 34/8, 58, 184, 187; 210/787, 781, 360.1; 414/411; 134/17, 33

[56] References Cited

U.S. PATENT DOCUMENTS

| | | | |
|---|---|---|---|
| 4,300,581 | 11/1981 | Thompson | 134/57 |
| 4,571,850 | 2/1986 | Hunt et al. | 34/133 F |
| 4,693,017 | 9/1987 | Oehler et al. | 34/58 |
| 4,907,349 | 3/1990 | Algo | 34/58 |

*Primary Examiner*—Henry A. Bennet
*Assistant Examiner*—Denise L. F. Gromada
*Attorney, Agent, or Firm*—Wells, St. John, Roberts, Gregory & Matkin

[57] ABSTRACT

A processor for centrifugal processing of semiconductor wafers and similar units without a wafer carrier. The processor is specially constructed to provide an automatically extendible and retractable rotor head to allow automated loading and unloading of discrete wafers onto the rotor head. The rotor head includes means for holding the wafers in spaced discrete relationship without a carrier. The processor includes a novel shaft assembly construction which includes an axially extendible shaft controlled using pressurized fluid. The pressurized fluid is supplied to the shaft assembly by a pressure supply which is controllably extendible and retractable for engagement with the shaft assembly when rotation is stopped. The shaft assembly also preferably incorporates an axial locking mechanism which holds the axially movable components of the shaft assembly in fixed axial position during rotation, while allowing release when rotation is stopped so that movable portions of the shaft assembly can be axially extended.

9 Claims, 18 Drawing Sheets

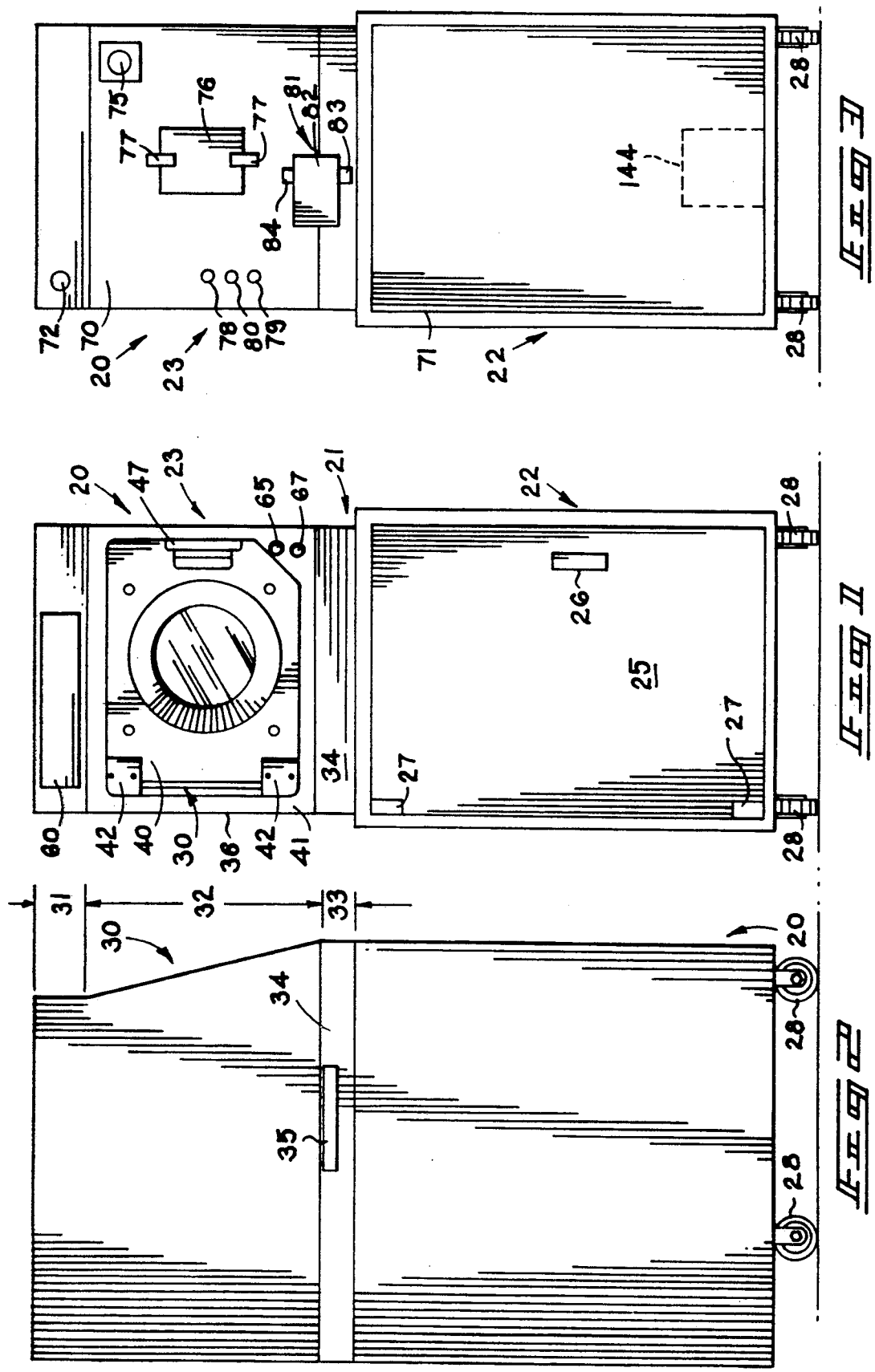

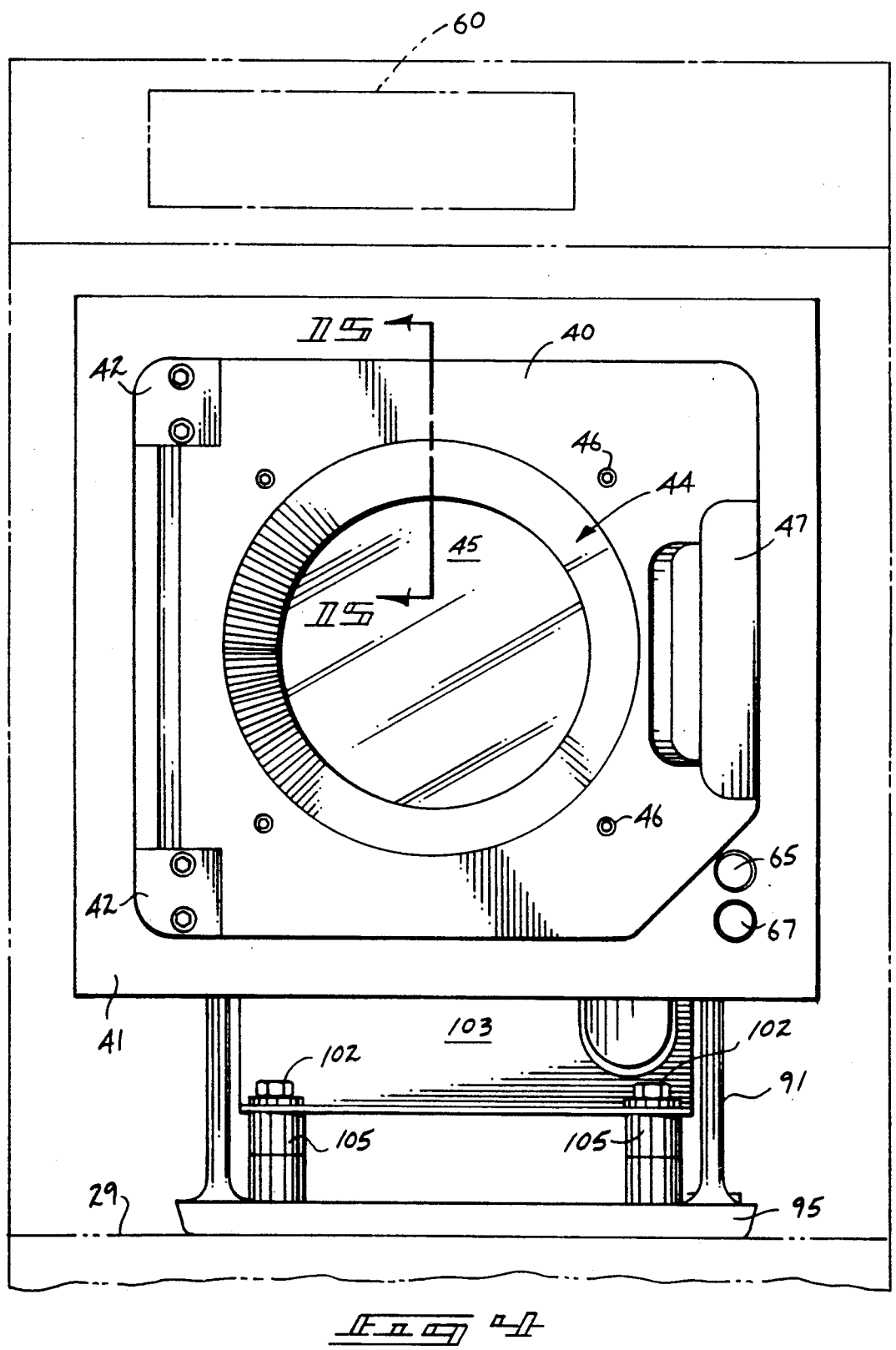

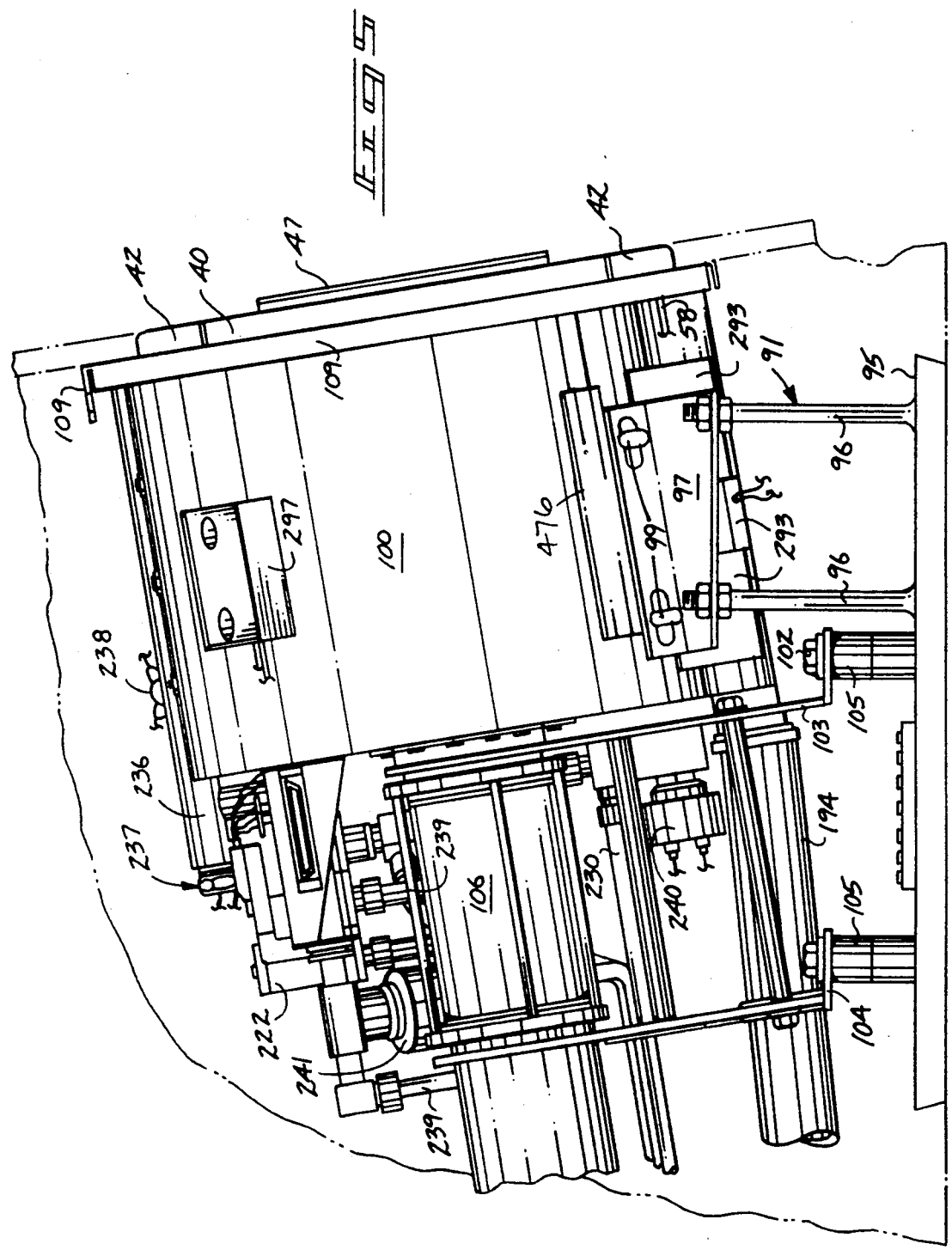

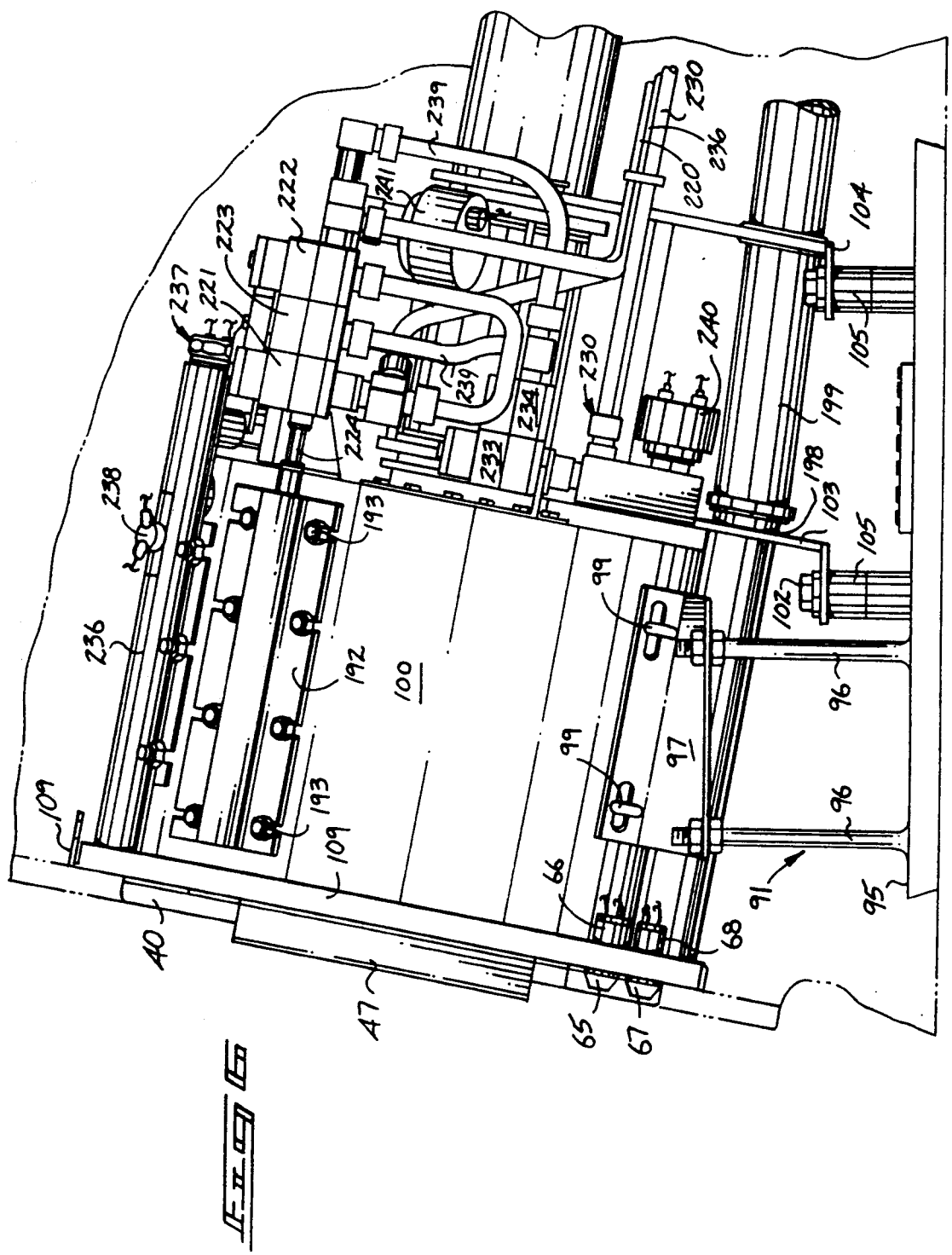

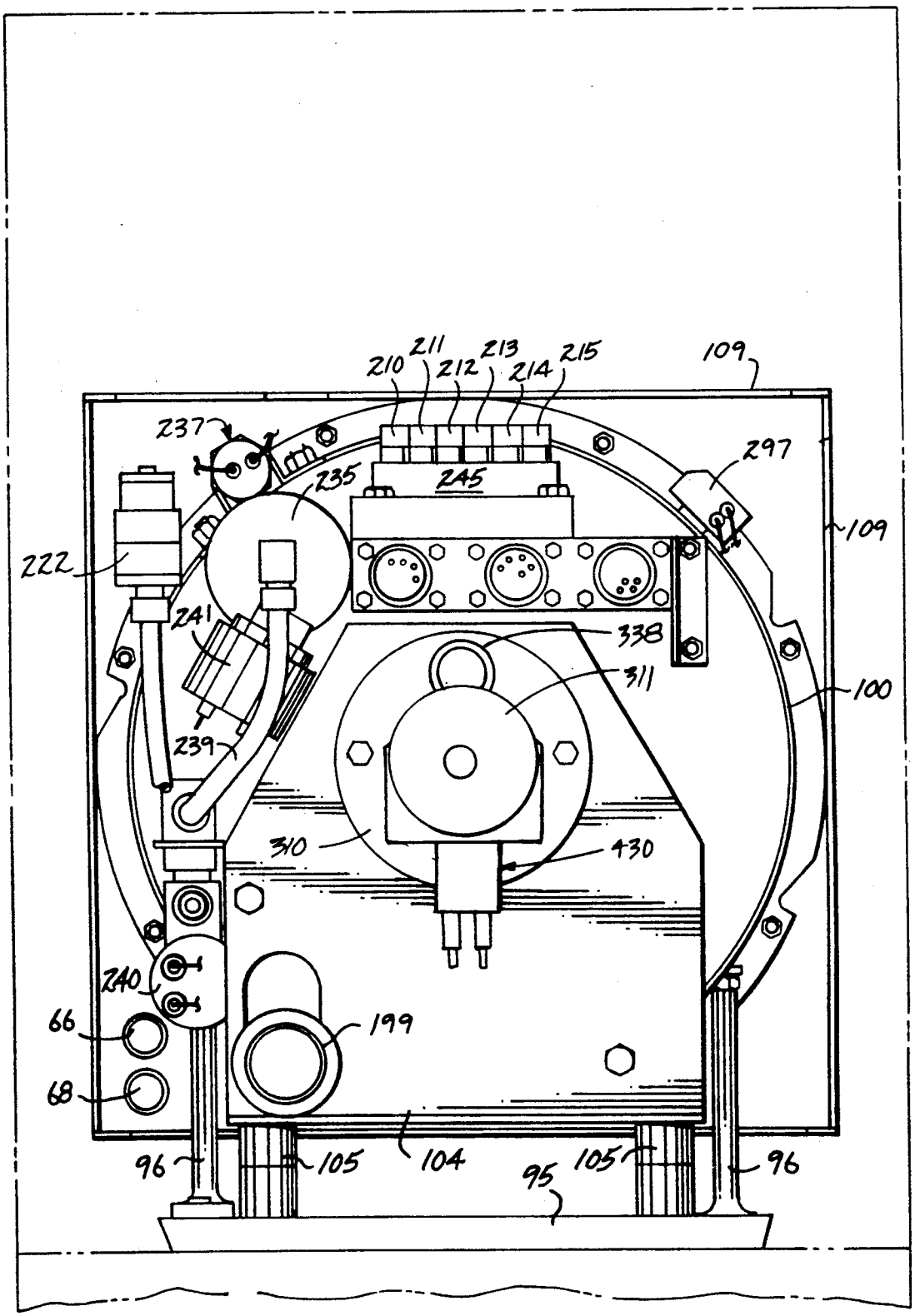

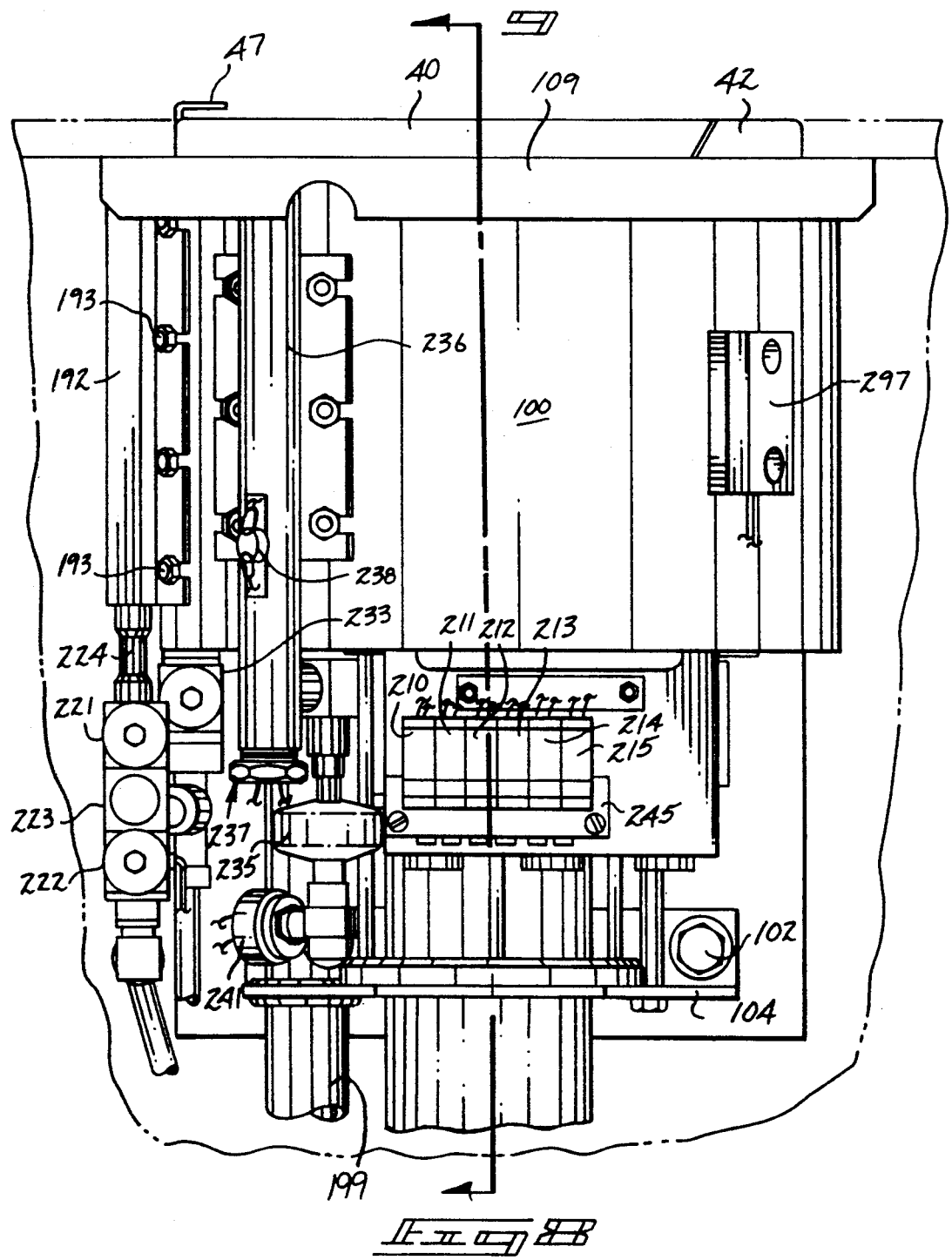

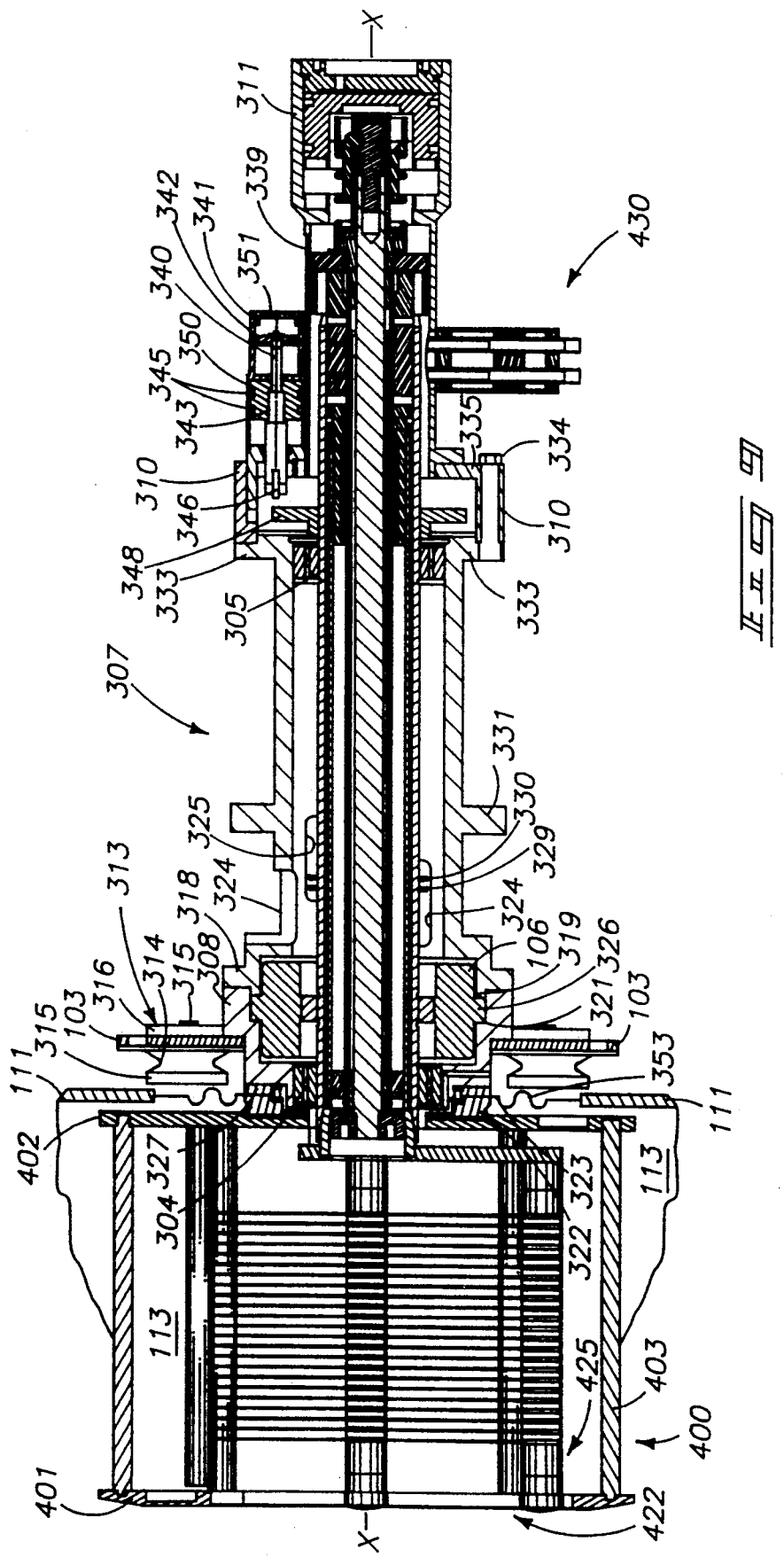

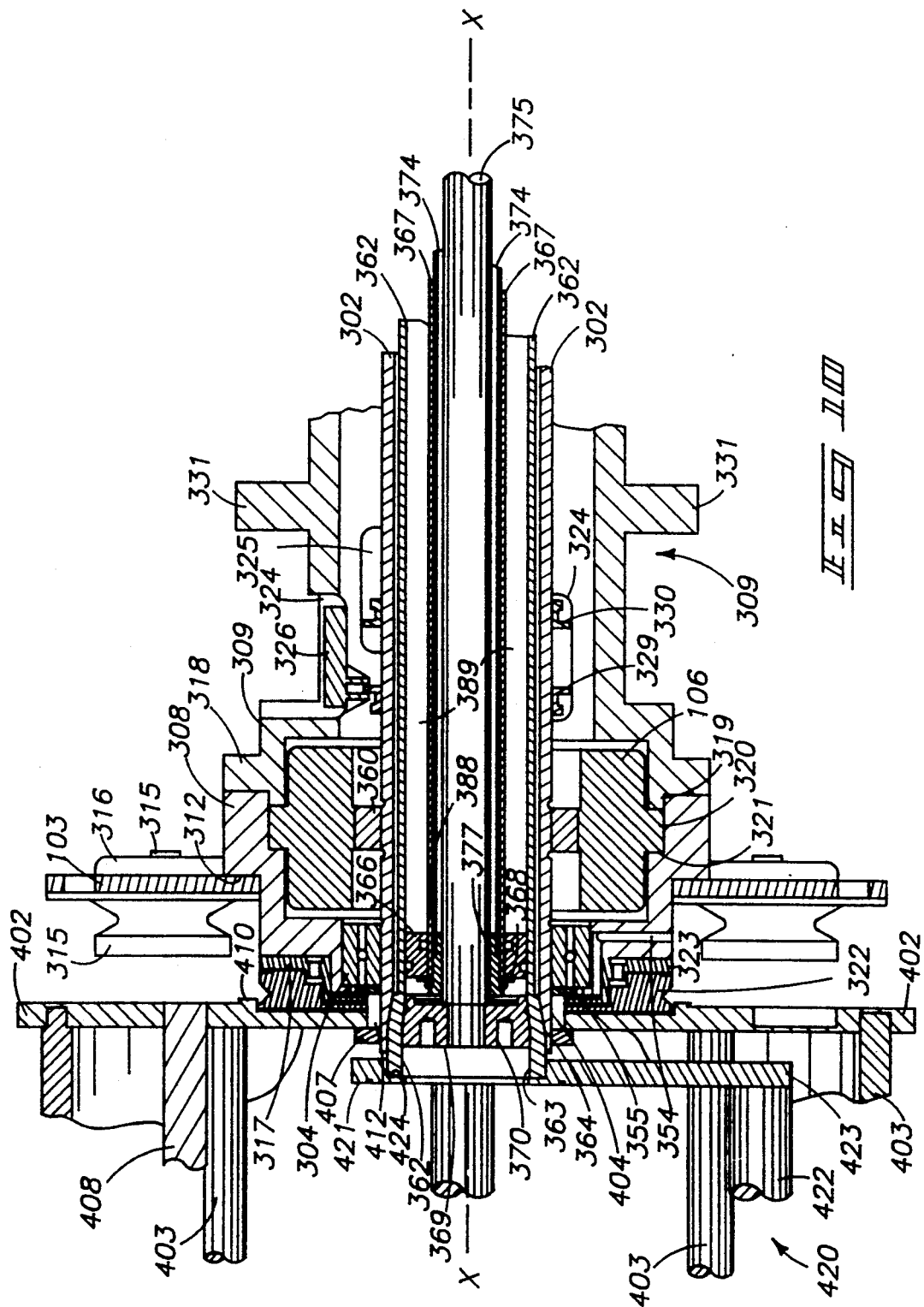

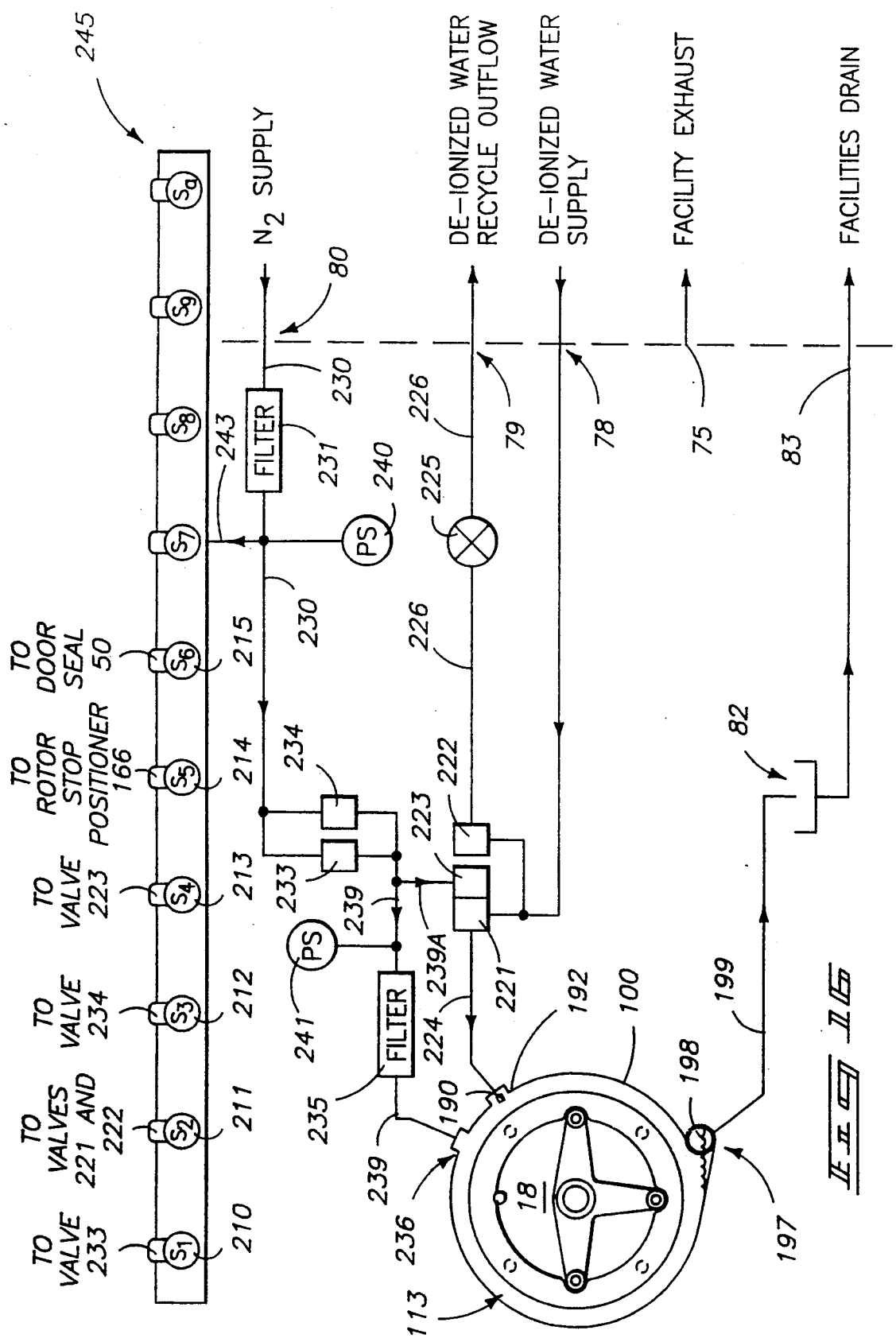

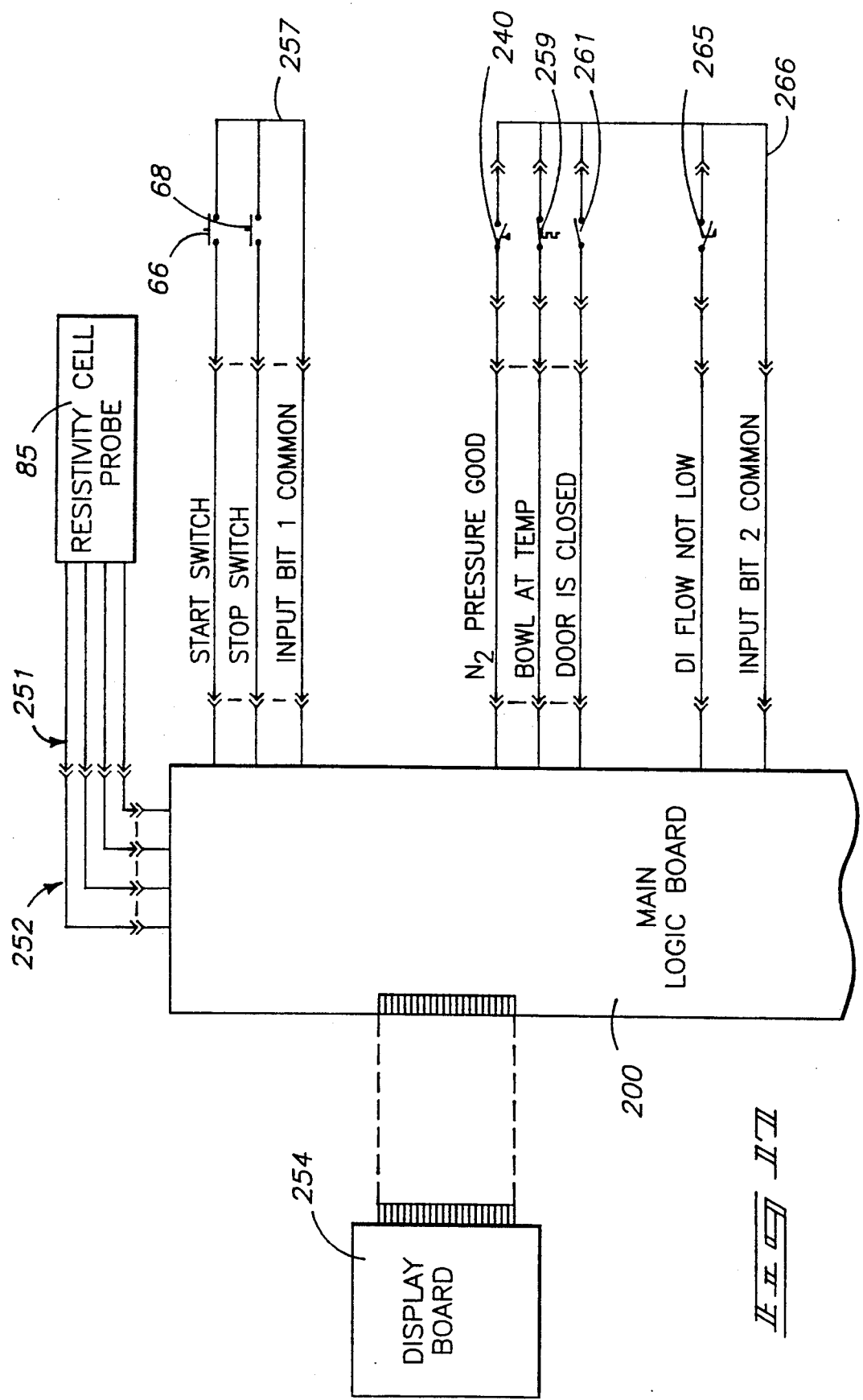

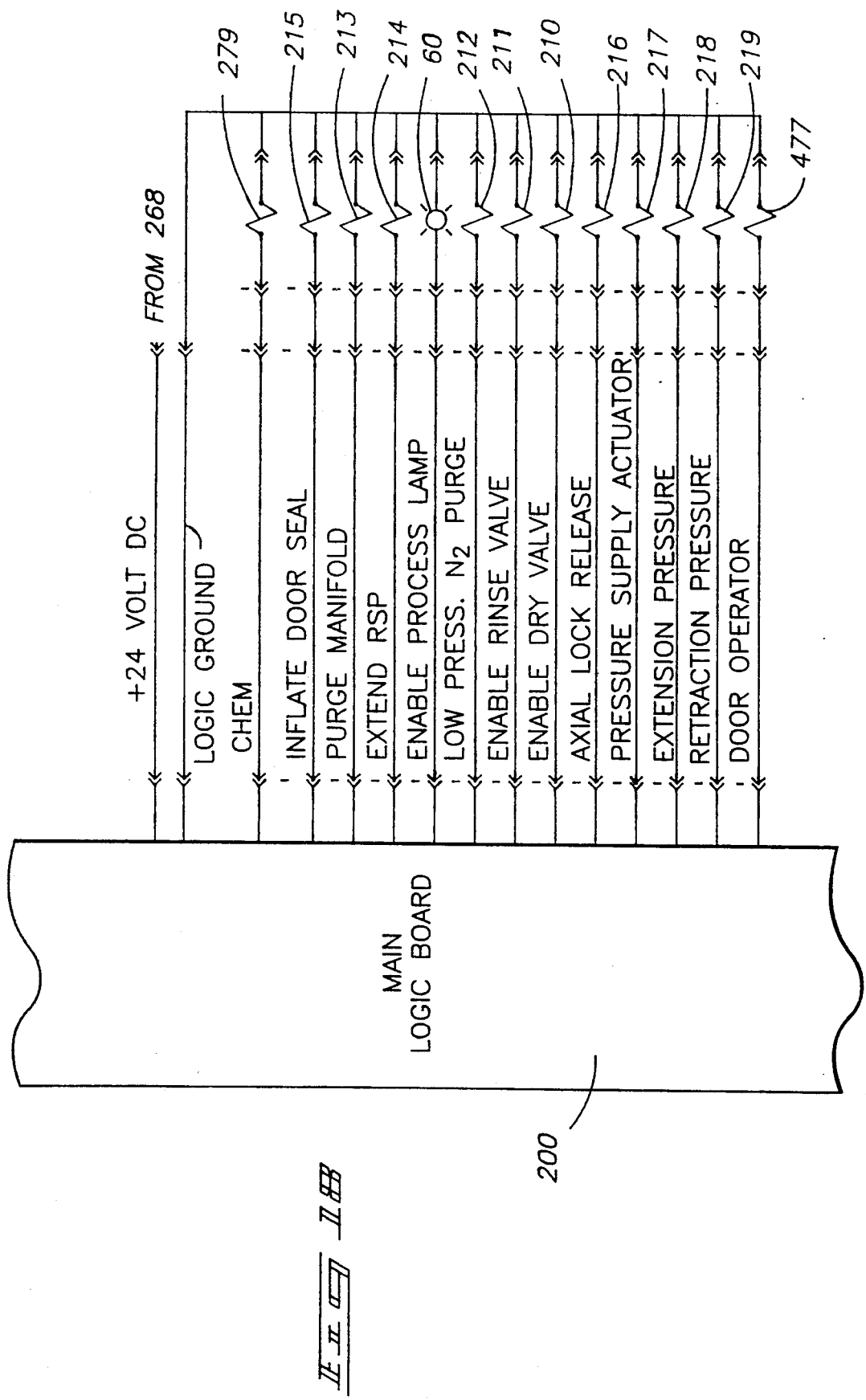

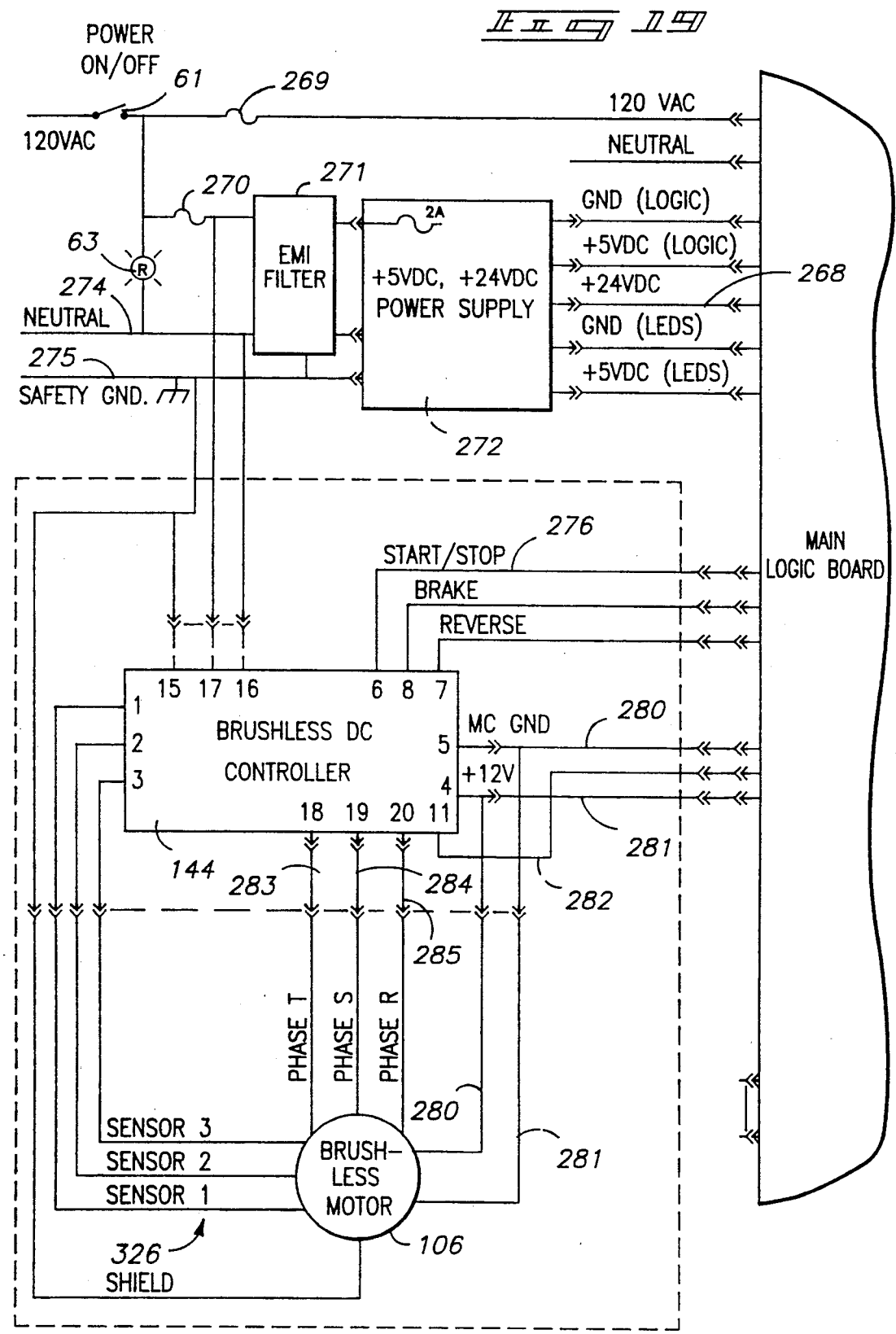

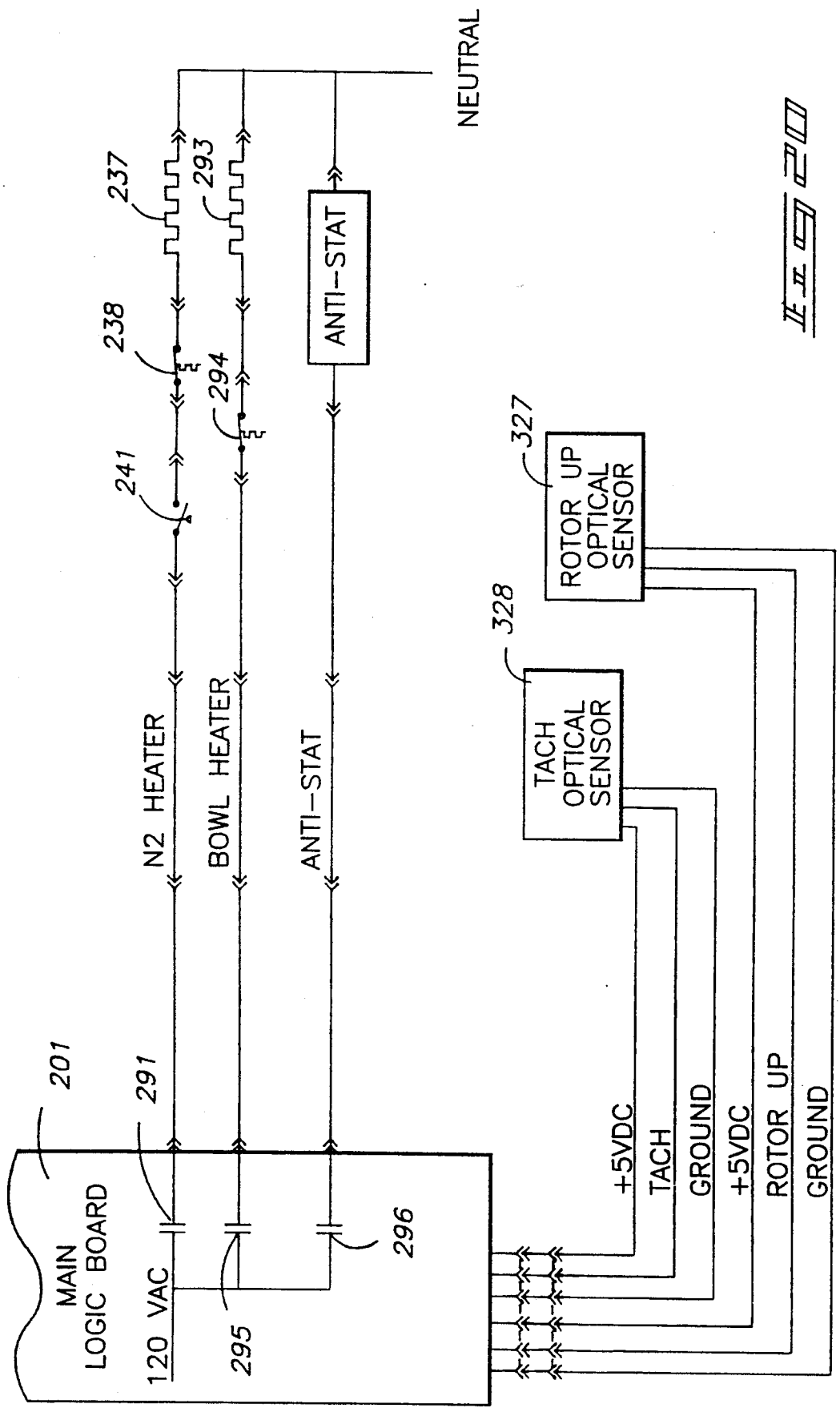

SEMICONDUCTOR PROCESSOR WITH EXTENDIBLE RECEIVER FOR HANDLING MULTIPLE DISCRETE WAFERS WITHOUT WAFER CARRIERS

TECHNICAL FIELD

The technical field of this invention is centrifugal semiconductor processing equipment and methods used to process semiconductor wafers, photomasks, optical disks, magnetic disks or similar units.

BACKGROUND OF THE INVENTION

The production of semiconductor wafers, substrates and photomask plates used in the production of semiconductor wafers, has typically utilized processing equipment in which various types of processing fluids are used to treat the wafers. One example of a semiconductor processor is a centrifugal rinser-drier used to rinse acids, caustics, etchants and other processing fluids from wafers, photomask plates, and similar units. The rinser-driers are also used to dry the rinsed units using a flow of heated gas, such as nitrogen, which is passed through the processing chamber after rinsing with the desired fluid. The wafers are spun during processing to provide more even distribution of the processing fluids across the wafer surfaces, and to assist in removal of rinsing liquids in preparation for drying.

Other types of semiconductor processors include acid and caustic treatment tools which spray or otherwise apply acids and caustics to the wafers or other semiconductor-related units. Stripping processors are used to remove photoresist from the wafers. Other specific processing of semiconductors may require other types of chemicals. Many of these processes are appropriately performed in centrifugal processing machines also to provide for even distribution of fluids over the wafer and to aid in removal of liquids.

A primary problem in the production of semiconductors is particle contamination. Contaminant particles can affect the photographic processes used to transfer the chip layouts onto the wafers being processed into chips. Contaminants on the photomasks can cause deterioration of the image being transferred onto the wafer. The direct processing of the wafers themselves is even more susceptible to contamination because of the numerous processing steps which typically occur and the risk at each stage that contaminating particles can become adhered to the surface of the wafer. If the contaminants are present on the surface of the wafer when it is processed in a diffusion furnace, then the contaminants are transferred into the surface of the wafer and cannot in general be removed by subsequent processing. Particle contamination typically causes approximately 50-60% of the chips in a wafer to be defective. Thus it is very important to reduce contamination to increase yields.

Because of the high resolution which has been made possible through newer semiconductor processing techniques, the effects of contaminants has become even more significant and problematic than in the past. Approximately ten years ago contaminant particles smaller than 1 micron were not a problem due to minimum feature sizes of 2 microns or larger. However, now the feature size used in high density chip designs is consistently 0.5 micron. Planning is already progressing for even higher density chips which require feature sizes of approximately 0.3 micron, with even smaller feature sizes expected in the future. The move toward smaller feature size is compounding the contamination problem because of the greater difficulty in controlling smaller particles and the greater numbers of smaller particles. It has been found that the numbers of particles within a given size range is highly non-linear and is believed to approach a geometric relationship. Thus with decreasing feature size the number of contaminating particles which must be controlled or eliminated increases geometrically. If contaminants are present then substantial numbers of the resulting chips can be rendered defective and unusable, at substantial costs to the manufacturer.

The causes of contaminating particles on wafer surfaces occurs from numerous sources. Each of the processing chemicals used is necessarily impure to some small degree. The water used in processing is deionized to remove metallic ions and other impurities, but such supplies also contain some impurities. Also of equal or greater importance is the presence of environmental dust carried in the air in which the wafer is moved between the various processing machines. To reduce this environmental contamination the manufacturers of semiconductors have built production areas which have relatively low amounts of environmental dust. These so-called "clean rooms" are extremely expensive to build and expensive to operate in a manner which maintains contaminant particle levels at acceptably low levels. With the decrease in feature size to provide more dense chips, the difficulties in providing sufficiently low environmental dust levels have increased.

A significant problem in prior art centrifugal processing machines was the need for manual loading and unloading of wafers into these machines. Manual loading was necessary because of the difficulty in accurately placing a wafer carrier containing 20-25 wafers into and out of an enclosed processing chamber of a centrifugal machine which has rotor parts which must accurately position and appropriately maintain the wafers at a desired location for high speed rotation. Manual loading and unloading can significantly slow processing since transfer to the following processing step does not occur when the human operator is occupied with other tasks, such as unexpected problems or other processing equipment. Decreased processing times at each station or machine due to continuing processing improvements further complicates the operator's work and increases the risk that processing rates are limited by manual handling of wafers.

The manual handling of wafers also adversely affects the need for great cleanliness in the processing of such wafers. Properly functioning automated equipment reduces the risks of particle contamination from humans and speeds handling of wafers from one process to the next. It also reduces foot traffic into and around clean rooms which is a significant factor in total processing area contaminant counts.

It has been found desirable to process wafers without handling them in a wafer carrier, as is done in the industry at this time. Wafer carriers are sources of particle contamination. They also present obstructions to rinsing or processing fluid sprays and therefore cause decreased uniformity in the processing of the wafers across the wafer surfaces and from wafer to wafer. Accordingly, the current invention seeks to provide improved processing without utilization of wafer carriers.

Accordingly, there is a substantial need for improved centrifugal semiconductor processing equipment and processing methodologies which can allow efficient automated handling without wafer carriers while maintaining low contamination of the wafers, photomasks or other units being processed.

BRIEF DESCRIPTION OF THE DRAWINGS

One or more preferred embodiments of the invention are illustrated in the accompanying drawings, which are briefly described below.

FIG. 1 is a front elevational view of a preferred semiconductor processor made according to this invention.

FIG. 2 is a left side elevational view of the processor of FIG. 1.

FIG. 3 is a rear elevational view of the processor of FIG. 1.

FIG. 4 is an enlarged front view showing in isolation an internal assembly which is a part of the processor shown in FIG. 1, but removed from the external cabinet.

FIG. 5 is a left side elevational view showing the internal processor assembly of FIG. 4.

FIG. 6 is a right side elevational view showing the internal processor assembly of FIG. 4.

FIG. 7 is a rear view of the internal processor assembly of FIG. 4 taken along the inclined axis of the rotor.

FIG. 8 is top view of the internal processor assembly of FIG. 4 taken perpendicular to the longitudinal rotor axis.

FIG. 9 is a longitudinal sectional view of the internal assembly taken along line 9—9 of FIG. 8.

FIG. 10 is an enlarged sectional view showing a frontward portion of the contents of FIG. 9 in greater detail.

FIG. 16 is a fluid flow schematic diagram for the process fluids typically used in the processor of FIG. 1.

FIGS. 17-20 are electrical schematic diagrams showing the preferred electrical system included in the processor of FIG. 1.

DETAILED DESCRIPTION OF THE PREFERRED EMBODIMENTS

Figure 11:
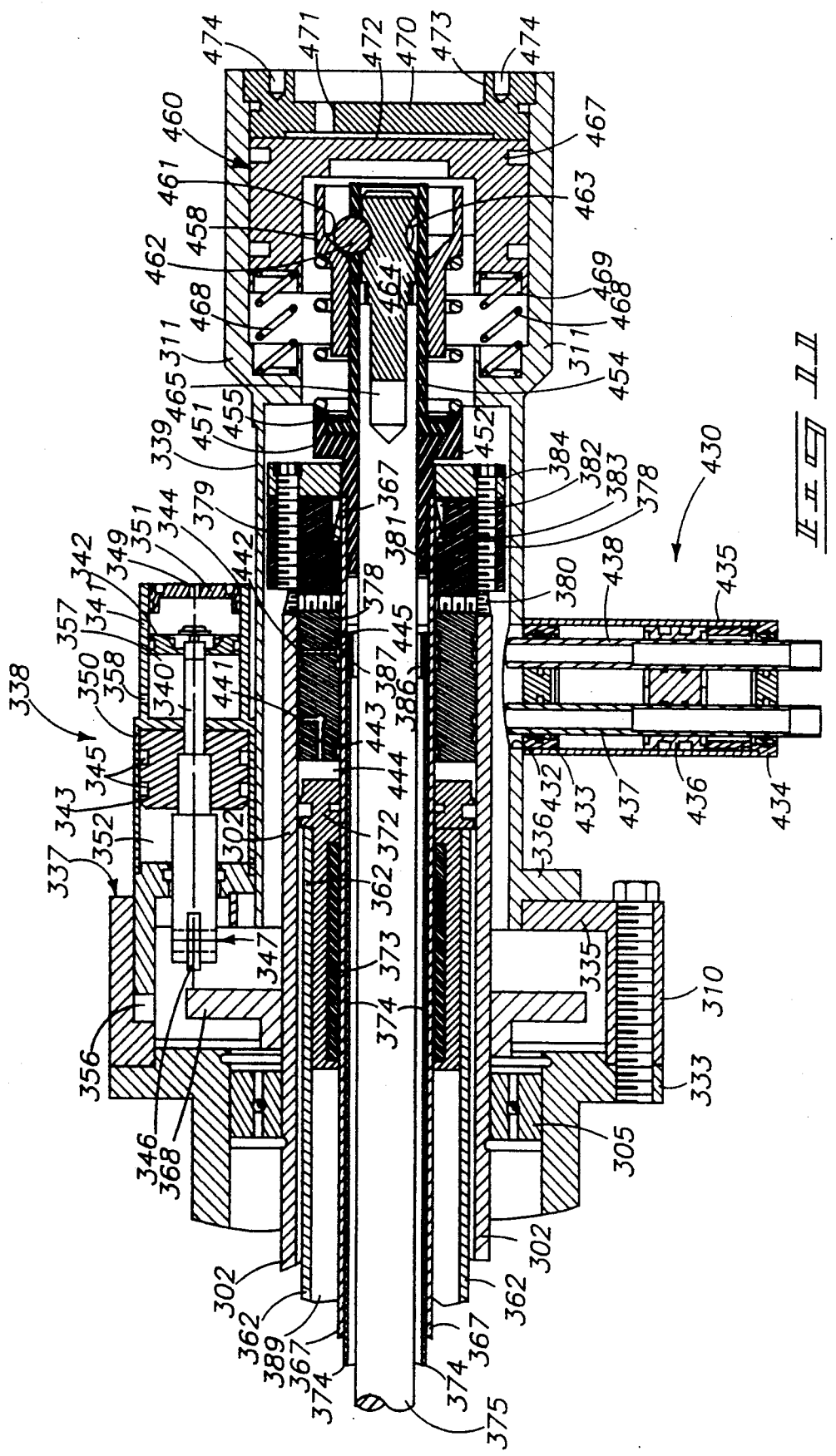
FIG. 11 is an enlarged sectional view showing a rearward portion of the contents of FIG. 9 in greater detail.

This invention disclosure is submitted in furtherance of the constitutional purposes of the Patent Laws "to promote the progress of science and useful arts" (Article 1, Section 8).

FIG. 1 shows a preferred semiconductor processor 20 in the form of a combined rinser and dryer. The rinser-dryer is designed for accomplishing either or both rinsing and or drying functions. The rinser-dryer is adapted to simultaneously process one or more wafers, preferably thin flat wafers which are typically circularly disk-shaped. Appropriate wafers for processing in processor 20 include semiconductor wafers, photomasks or other semiconductor units 18. Appropriate materials and units which can be processed in processor 20 include silicon units, gallium arsenide units, indium phosphide units, glass units, ceramic units, solar cells, magnetic and optical memory disks, and flat panel displays.

The processor can be used for water rinsing, solvent cleaning, freon cleaning, potassium hydroxide processing, soap and surfactant solutions, carrier cleaning, parts cleaning, and disk cleaning. Modified versions can alternatively be used for acid and other etchant processing. Product sizes typically range from approximately 25 millimeters in diameter to approximately 400 millimeters square. The processor 20 as shown and described is advantageously adapted for carrying and processing a number of wafers or similar units.

Processor 20 includes a cabinet 21 which can be constructed in any one of several preferred configurations, including the console model shown, or a bench top model (not shown), or a stacked unit having multiple rinser-dryers in one cabinet (also not shown). Cabinet 21 includes a base portion 22 and an upper console portion 23. The base portion is advantageously adapted to provide an internal storage compartment which is accessed through the front cabinet door 25 having a handle 26 and hinges 27. The lower portion is also provided with a set of casters 28 to facilitate relocation of the processor.

The upper console portion cabinet 23 is preferably fabricated in two basic parts; a lower containment tray 34 and an upper shroud 36. The containment tray has a bottom which will hold minor leakage until maintenance can be performed. The cabinet also preferably includes a supporting shelf under the control electronics which are adjacent to control panel 60.

The upper console is provided with a front 30 which is specially adapted to minimize contaminants. The front surface includes an upper front section 31, angled medial section 32, and a lower front section 33. The upper and lower sections 31 and 33 are substantially vertical and offset with the upper section displaced rearwardly relative to the lower section. The medial section 32 is obliquely angled at an incline angle to connect between the upper and lower sections and form a smooth frontal contour relative to a volume of air which is downwardly flowing in typical semiconductor processing clean rooms. The angle of the medial section is preferably the same as the inclination angle of the longitudinal axis of the rinser-dryer rotating assembly, as will be discussed more fully hereinafter. The front surfaces of the lower portion of cabinet 22 also meet the front surfaces of lower section 33 to form an overall smooth frontal surface for the processor. This frontal surface shape configuration is adapted to preclude or reduce generation of turbulence which can be caused by discontinuities present in a downwardly flowing laminar airflow. The laminar airflows are typically provided in semiconductor production clean rooms to force airborne contaminants downwardly and out of the clean rooms through appropriate exhaust ducts. This frontal surface construction of the cabinet minimizes the pickup of dust and other particles which might otherwise be caused by turbulence over the face of the cabinet, particularly at ledges or other discontinuous surfaces which are typical of current semiconductor processing equipment in the industry. The cabinet is preferably made from a suitable polymer material such as polypropylene sheet material, approximately 14 millimeters thick.

The sides of the upper console are advantageously provided with a pair of side handles 35 which facilitate the relocation of the processor 20 and allow easier removal of the upper portion 23. The handles are advantageously formed as slots cut in the sidewalls of the cabinet. This allows the upper portion containing the rinser-dryer internal assembly to be more easily lifted and maintained such as by placement of the upper part onto a workbench or the like.

Figure 14:
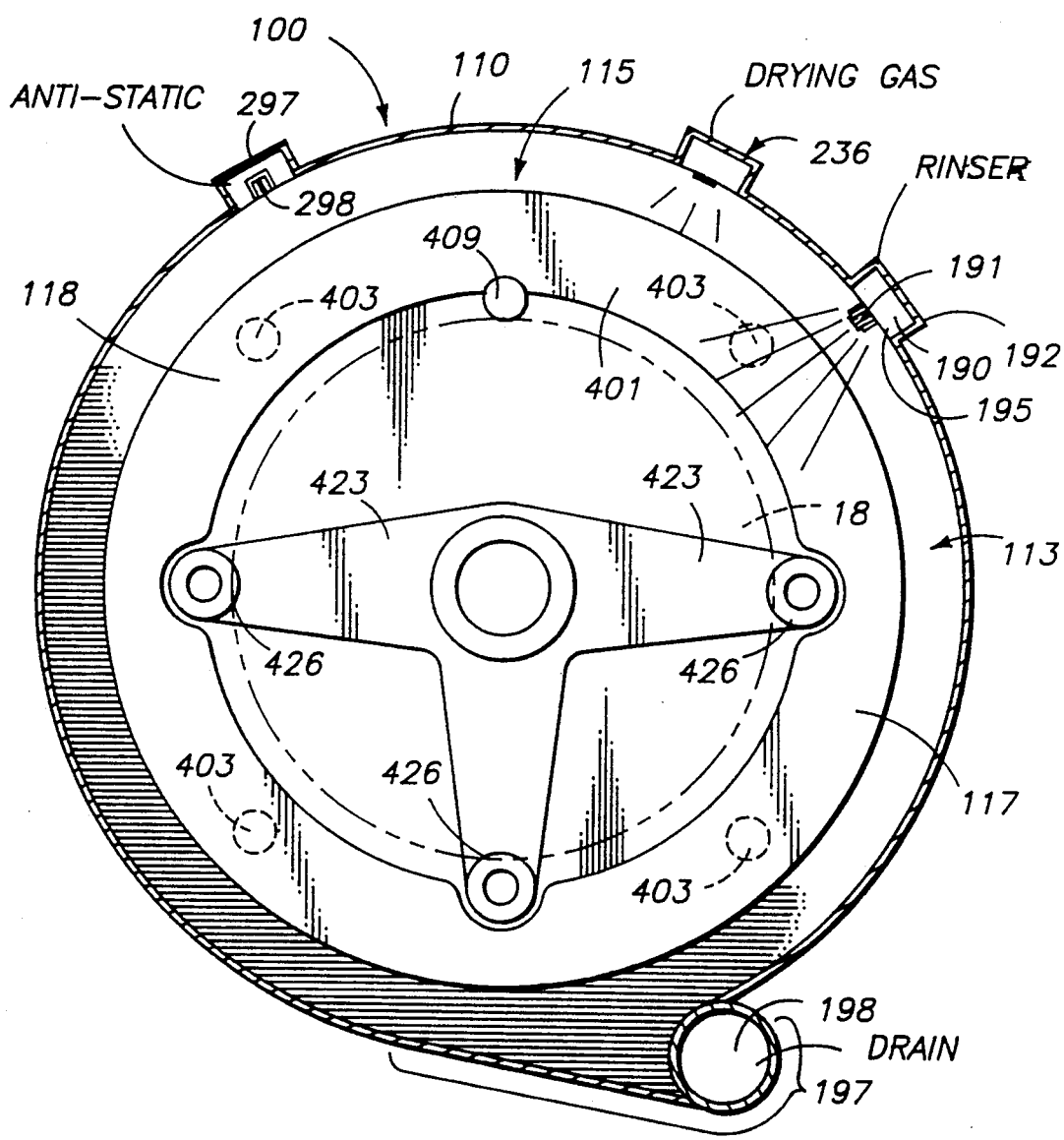
FIG. 14 is a schematic front view showing in isolation the processing chamber and wafer holding rotor advantageously included in the processor of FIG. 1.

FIGS. 1 and 14 show that the rinser-dryer includes a frontwardly opening processing enclosure access door 40. Door 40 acts as a closure which covers and closes a front access opening 37 of the processing enclosure. Access door 40 is mounted to a front frame panel 41 using a pair of hinges 42 or other suitable door suspension means. The door is advantageously power driven to allow automatic opening of the door using a suitable door operator 476 (FIG. 5) which extends a pneumatic ram connected to the door near the lower hinge. The processor 20 can be constructed to provide either a right-hand or left-hand swing for door 40. The door 40 includes a door panel 43 which serves as the primary structural member of the door, and is connected to the hinges 42. The door panel is advantageous made from polypropylene, or other suitable materials consistent with the particular service requirements of the processor being made. In general the door panel 43 is not directly exposed to the process chemicals or other fluids used within the processing chamber; however, some indirect exposure may occur and materials suitable for such exposure are preferred.

The door also advantageously includes a window or sight glass 45 which allows visual examination of the interior processing chamber and its contents. The window 45 is advantageously made of a high quality sheet acrylic material having good optical properties and chemical resistance to the process fluids used in the particular machine involved. The window is mounted across a window or sight opening 44 formed in the door panel 43. The window 45 is mounted to the door panel using four fasteners 46 which extend through suitable apertures formed in the door panel and into threaded apertures at corresponding positions in the window.

Figure 12:
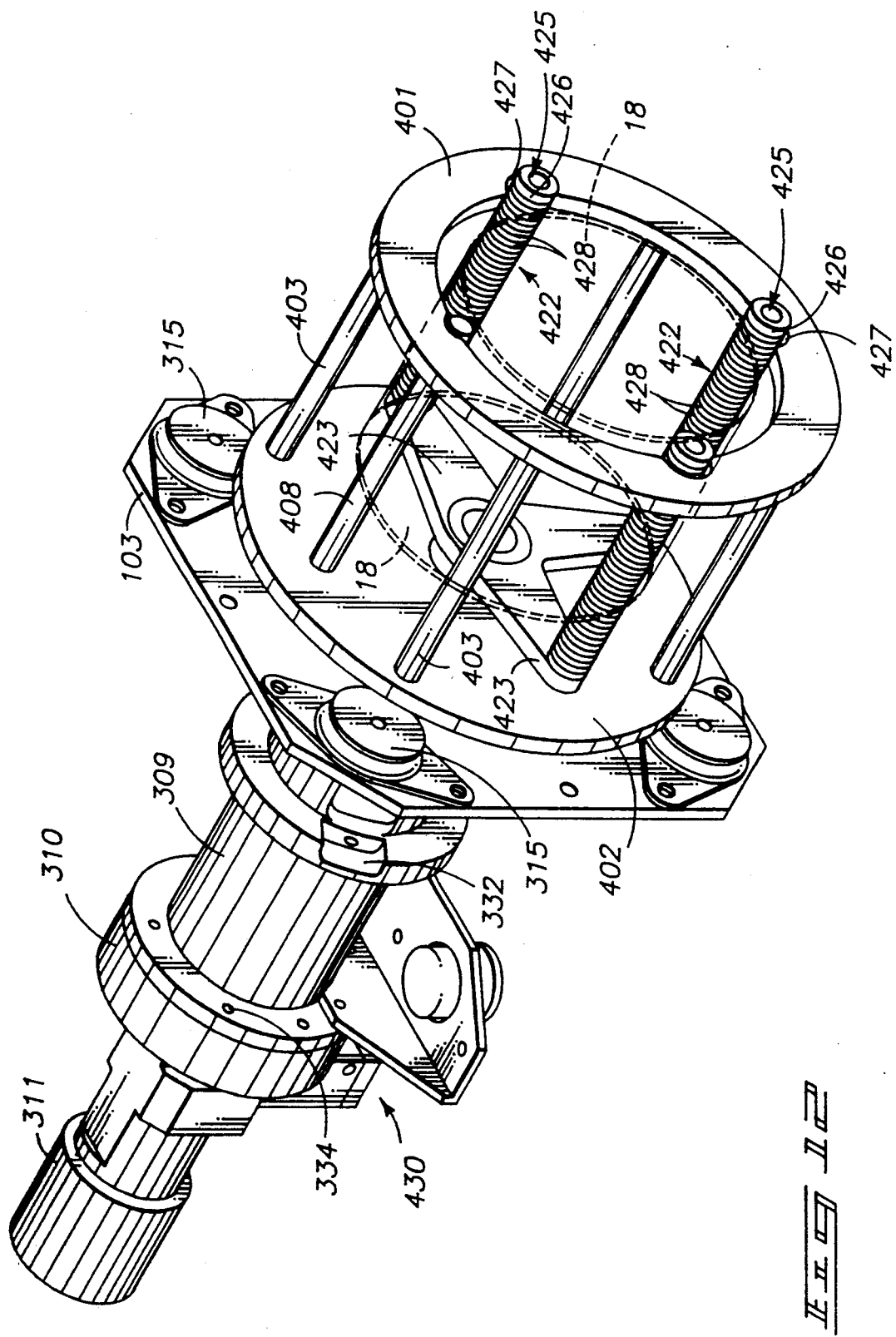
FIG. 12 is a perspective view showing isolated portions of the processor of FIG. 1 with the wafer support in a retracted position.
Figure 15:
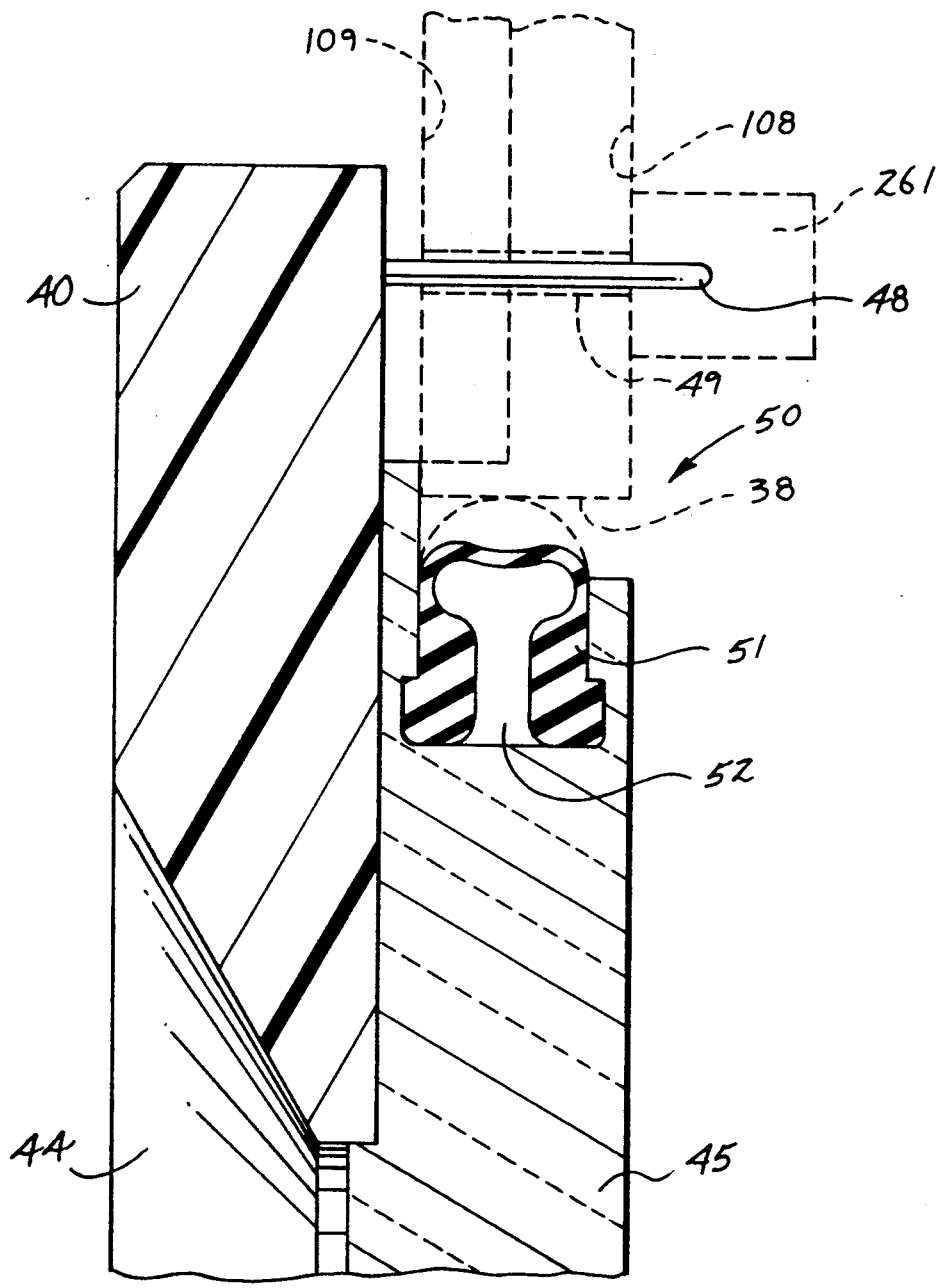
FIG. 15 is a partial sectional view of the access door taken along line 15—15 of FIG. 4.

Window 45 is advantageously provided with a seal 50 which serves to seal against the interior perimeter of the front access opening 37 of the processing enclosure. FIG. 15 shows that seal 50 includes an expandable sealing member 51 which is provided with an enclosed expansion chamber 52. The expansion chamber is connected to a suitable supply or source of expansion fluid, such as pressurized air or preferably nitrogen. The expansion fluid is supplied using a suitable expansion control valve 215 (FIG. 16) or other suitable door seal expansion control means. The seal operates by pressurizing the internal expansion chamber 52 with the expansion fluid after the door has been fully closed. The expansion fluid is advantageously supplied through a expansion fluid conveying passages formed in the door panel and lower door hinge assembly. The hinge pin is hollow and provided with a fitting 58 (FIG. 5) which receives nitrogen from valve 215 (FIGS. 7 and 12). The nitrogen is conveyed along the hinge pin and is supplied through the hinge block which swings with the door. Passages formed in the door panel convey fluid from the hinge block to the mating passages formed in the window which communicate with the bottom of the groove 54 which receives the sealing member 51. Other suitable means for conveying the expansion fluid to the internal expansion chamber 52 are alternatively possible.

Door 40 also advantageously includes a handle 47 opposite to the hinges and connected to the door panel 43. FIG. 15 shows schematically the inside face of the door panel is provided with a safety actuator pin 48 which extends through a safety actuator pin aperture 49 formed in the front frame panel 41 to contact the closed door safety switch 261.

FIG. 1 also shows that the front of the processor preferably includes a control panel 60. Control panel 60 preferably includes an on-off power switch 61. The control panel also includes an operational display 62 which includes a number of suitable display elements, such as light emitting diode displays, capable of generating visually perceivable alphabetic or numeric representations. The display can be dedicated to particular functions, such as process step, resistivity of outflow, or revolutions per minute. Alternatively, or additionally, one or more of the displays can serve additional diagnostic, maintenance or other desirable display function. The control panel further preferably includes a mode control switch, cursor adjustment switches and digit change switches for allowing programming of process recipe times, angular speed, and steps. The front of processor 20 is also provided with a start control button 65 which controls associated start switch 66 (FIG. 17), and stop control button 67 which controls associated stop switch 68 (FIG. 17).

FIG. 3 shows a rear view of processor 20 including the rear walls 70 and 71 of the upper and lower console sections 23 and 22, respectively. The upper section 23 includes an electrical power supply connection 72 which is in the form of a suitable recessed plug for connection to a power cable which is preferably capable of supplying 3 phase alternating current power. The rear panel is also provided with an auxiliary exhaust fitting 75 which can be used to draw a slight vacuum on the interior of the cabinet to further reduce the potential for dust contamination due to operation of the processing apparatus 20.

FIG. 3 shows a removable inspection panel 76 which allows visual access to the interior of the cabinet and the internal assembly of the rinser-dryer. The panel is held in position by fasteners 77. The rear of the processor also includes a deionized water supply fitting 78. Deionized water is circulated through the processor to assure that bacteria will not propagate in stagnant water lines, so a deionized water recirculation outflow fitting 79 is also provided to remove such flow from the machine. Also provided is a nitrogen gas supply fitting 80.

The rinse water or other liquid effluent from the rinser-dryer is handled through a drain line fitting 81. The drain line fitting 81 is preferably provided with a removable drain box 82 which advantageously includes a strainer to retain broken pieces of semiconductor wafers or other debris which occasionally discharges from the processing chamber. The drain box has a drain fitting 83 which is connected to a suitable liquid waste disposal system for the building. The drain box also includes a vent 84 which exhausts drying nitrogen. An outflow resistivity monitor 85 (not shown in FIG. 3, see FIG. 17) is advantageously mounted within the drain box 81 and is connected to a display or the processor control system if desired for operation or control of the processor.

FIGS. 4-8 show an internal assembly 90 which is the primary mechanical and operative assembly of the rinser-dryer semiconductor processor 20. The internal assembly includes a internal assembly framework 91. The framework 91 includes a base plate 95 which is adapted to rest upon the horizontal surface 29 formed in the lower containment tray 34 of the processor upper cabinet. Framework 91 preferably includes two frame sub-assemblies; a front or processing enclosure framework 92, and a rear or rotating assembly support frame 93. Both sub-frames 92 and 93 are connected to base plate 95. The front or first frame 92 is provided with a plurality of upright frame members 96 which extend upwardly from the base 95 and support side mounting brackets 97. The side mounting brackets are preferably removable and adjustably mounted to the uprights 96. The side mounting brackets are secured to the process enclosure container 100 using connection fasteners 99.

The rear or second frame 93 is connected to base plate 95 using mounting bolts 102 which extend through apertures in feet formed on front and rear second frame members 103 and 104. The feet rest upon support blocks 105. The upper support blocks are preferably adapted for dispersing the load over the lower support blocks and can be made from steel. The lower support blocks which are preferably made from shock isolating elastomeric material such as rubber or other suitable materials. Both the upper and lower support blocks are shown cylindrical and include axial through bores for receiving the mounting bolts 102 therethrough. The frame members 103 and 104 extend upwardly to form a motor mounting arrangement for the motor 106. These frame pieces also support numerous other components forming the internal assembly 90.

The processing enclosure or bowl 100 is advantageously formed of several parts connected to provide an integral bowl structure which is essentially fluid tight when closed. The front of the enclosure includes a front end wall member 108. The front end wall member 108 is partially a planar annular piece having a front wall access opening 37 defined therein within the central portions. The front access opening has an annular internal access opening flanged wall 38 which is advantageously used as the sealing surface against which the door seal 50 is expanded and sealed. The front face of front wall member 108 is mounted with a face piece 109 which is provided with flanges about the outer perimeter acting as stiffening ribs. The face piece 109 is mounted adjacent to the inside of cabinet front wall 41 when the internal assembly is mounted therein.

The rearward face of the front end wall member is securely affixed to the side wall enclosure member 110. Side wall member 110 is roughly cylindrical in shape and provided with a drain structure along the lower or bottom side to cause liquid drainage from the bowl. The bowl is advantageously oriented at a rearwardly sloping angle of approximately 10° from horizontal, although inclination in the approximate range of 0°-30° are also suitable. Horizontal orientation of the rotational axis may be alternatively preferred as necessary or appropriate to provide effective robotic loading and unloading. In applications where the robotic loading and unloading system can deliver the wafers at various inclined angles then an inclined orientation is preferred. Alternatively, in applications where the robotic loading and unloading is not so capable, then a horizontal rotational axis is preferred.

The rearward end wall of the enclosure is formed by member 111 which is secured to the side wall member 110 by a suitable connection such as the lapped and welded joint shown in FIG. 9. The central portions of rear end wall 111 are removed to form a rotor opening 112. The rotor opening allows a cantilevered rotor assembly to extend into the processing chamber 113. The rotor opening 112 is provided with a sealing arrangement which will be described in greater detail below.

Contamination within processing chamber 113 can further be reduced by appropriately finishing the interior surfaces of the processing enclosure 100. Either, or more preferably both, are provided with a smooth polished surface and or passivated to reduce contamination. A preferred method is to electropolish the processing chamber surfaces using electrical current and a suitable electropolishing mixture known in the art which provides a smooth surface with reduced potential for chemical reactivity.

FIG. 9 shows a rotor processing head 400 mounted within the processing chamber. The rotor processing head is formed and functions as a semiconductor wafer holder for holding a plurality of discrete wafers without the need for a wafer carrier or cassette. The rotor head is mounted for rotation with rotary portions of a shaft assembly 300 driven by motor 106 as will be explained in detail below. The rotor head is also provided with extensible portions in the form of extension subassembly 420 (FIG. 10). The extension subassembly is axially extendible to allow robotic loading and unloading of the wafers to and from the rotor head.

The rotor head 400 includes a ring-shaped or annular front member 401 and a circularly disk-shaped rear member 402. The front and rear rotor pieces 401 and 402 are connected together by four rotor head bars 403 which extend longitudinally between pieces 401 and 402. The rotor head bars 403 are preferably positioned at approximately equal angular positions about the longitudinal rotational axis X—X of the rotating assembly. Bars 403 serve as structural members supporting the front ring 401 in a cantilevered position from the rear piece 402.

The rotor rear piece 402 is suitably connected to an outer shaft 302. As shown these parts are constructed with a close fit between a shaft opening 404 formed in the rear piece 402 and outer shaft 302. An end nut 407 is threaded onto the forward end of shaft 302, thus forcing a cylindrical axial extension of rotor piece 402 to bear upon a bearing face ring 355 which rotates with the inner race of bearing 304. The rear rotor piece 402 is secured for rotation with shaft 302 using a pair of keys which fit within corresponding keyways 412 formed in both the rotor and shaft. For purposes of illustration the keyways in shaft 302 are not shown in the drawings.

The rotor head is preferably provided with a wafer retaining bar 408 which is rigidly connected to the rear rotor piece 402 and extends forwardly to rest on the front rotor piece opening 406 at a suitable rest 409. The outer surface of retaining bar 408 is preferably coated or sheathed with a suitable material, such as TEFLON polymer.

Rotor head 400 also includes an extension subassembly 420. The extension subassembly includes an extension hub 421. The hub has three lobes 423 which extend outwardly in spaced radial directions to form a fork upon which to mount extension assembly support members 422. The radial spacing of the lobes is preferably at the bottom and opposing sides of the wafers being supported thereon. Support members 422 are rigidly connected to the lobes of the hub and extend longitudinally toward the front of the processor in a parallel arrangement which underlies and supports the plurality of discrete wafers held thereon. When the extension subassembly is extended (see FIG. 13) the supports 422 are cantilevered from the hub, to support the wafers. The outer ends of the support members 422 are provided with ends 425 which are preferably fitted with bushings 426. End bushings 426 bear upon rests 427 formed along the interior opening 406 of the front rotor ring 402 when the extension assembly is in the retracted position shown in FIGS. 9 and 12.

The support members 422 are provided with a plurality of spaced recesses or grooves 428. The grooves 428 are coordinated between the three support members. This coordination provides that the grooves be equally spaced and longitudinally positioned to be aligned in approximately the same plane normal to the longitudinal rotational axis X—X. This provides for the holding of a spaced parallel array of wafers 18 by the wafer supports.

The extension subassembly 420 is extended using extendible portions of the shaft assembly 300. The specifics of the preferred shaft assembly will be described hereinafter. Before such description the supporting housings and related components used to rotatably support and drive the shaft assembly will be described.

The rotating assembly primarily formed by rotor head 400 and the shaft assembly 300 is supported by bearings 304-5. Bearings 304-5 are preferably ball bearings. Bearings 304 and 305 are supported by a housing assembly 307 formed of four different housing parts 308-11.

The forward end of the housing assembly includes a first or front housing piece 308. Front housing piece 308 is mounted to upstanding frame member 103 using vibration reducing mounts 313. Mounts 313 include a resilient spacers 314 which are captured between frame 103 and the heads of fasteners 315. Fasteners 315 extends through holes formed in the frame and are secured to extensions 316 formed on the front housing piece 308. The rearward face of frame piece 103 bears against a shoulder 312 formed on housing piece 308. This construction reduces vibration transmission from the motor 106 to other parts of the processor.

The front housing piece 308 is provided with a forward shoulder 317 which mounts a first diaphragm mounting ring 322 and a second diaphragm mounting ring 323. A flexible bowl connection diaphragm 353 extends from between the mounting rings 322 and 323 to the back wall 111 of the processing enclosure. Diaphragm 353 forms a flexible boot between the housing supporting the rotating assembly and the processing enclosure. This construction minimizes vibration transmission between the parts and allows excursion of the rotating assembly in response to various forces developed during acceleration, deceleration and rotation of the rotating assembly.

The diaphragm mounting rings 322 and 323 also serve to form portions of a pressurized labyrinth gas seal between the stationary housing 308 and the rotating back piece 402 and associated rotational parts. The gas seal is supplied with nitrogen or other suitable purge gas through port 354 and into the seal area between the rotating and stationary parts. A peripheral V-shaped groove is advantageously provided in the internal part 322 to channel and guide liquids away from the adjacent outer opening of the gas labyrinth. A liquid deflection boss 410 is advantageously provided on the rearward face of the rotor back plate 402 to channel liquids within the peripheral groove formed thereby and reduce liquids flow across the annular outer opening of the gas labyrinth. A ring 355 is positioned in front of bearing 304 to reduce passage of purge gas through the bearing.

The second or intermediate housing piece 309 includes a front flange 318 which is adapted to mechanically couple with the rear of the front housing piece 308 using longitudinally extending bolts or other suitable fasteners (not shown) which pass through the flange and into the rear face of the front housing piece. The forward face of flange 318 is provided with a motor engagement boss 319 which fits within the interior bore at the rearward end of the front housing piece. The motor engagement boss bears upon the rearward face of a mounting ring 320 formed about the exterior of motor 106. The frontward face of mounting ring 320 is forced by boss 319 against an interior shoulder 321 formed within the front housing piece 308.

The intermediate housing 309 is also provided with a plurality of optical systems mounting apertures 324 and 325. The frontward set of apertures 324 mount a set of three rotor sensors used in the control of the brushless DC motor 106. These apertures and associated optical position sensors 326 are preferably positioned at equally spaced angular positions about the shaft at 120° are spacings. Optical sensors 326 utilize optical emitters, such as light emitting diodes (not shown), which emit light which is detected across a gap. A first or frontward optical intercept disk 329 alternately intercepts and passes light from the emitter to the optical beam detector to provide an indication of rotor angular position. The two rearward apertures 325 mount two additional optical sensors 327 and 328 (FIG. 20) similar to sensor 326 just described. Sensor 327 is used to confirm the appropriate (upright) angular positioning of the rotating assembly for loading and unloading of the wafers, as shown in the Figs. Optical sensor 328 is used to determine the direction of rotation and the speed of rotation. Sensors 327 and 328 are intercepted by a second or rearward optical intercept disk 330 which functions to alternately pass an optical beam as described above in connection with optical sensors 326. The control system processes the output of the optical sensor 328 to provide a speed signal indicative of rotor speed which is used in the controller to maintain the desired program or recipe of speed and time, and is also available for display on a display at processor control panel 60.

The intermediate housing piece 309 also includes a central flange 331 formed about the periphery at a central location rearward of the apertures 324 and 325. Flange 331 is advantageously provided with mounting receptacles 332 (FIG. 12) which serve to mount the optical detectors 327 and 328. Flange 331 also serves a structural function increasing the rigidity of the intermediate housing piece 309 immediately rearward of the apertures 324 and 325. It further serves to mount a cowling or cover over the annular space between flanges 318 and 331 to protect the sensor array mounted therewithin.

Housing piece 309 further includes a rear flange 333. Flange 333 strengthens the intermediate second housing piece 309 adjacent to rear bearing 305 and provides a mounting for a third housing piece 310. Third housing piece 310 is secured to piece 309 using a plurality of radially spaced fasteners 334 which extend through piece 310 into tapped holes in flange 333. Third housing piece 310 has a rearward flange 335 which extends inwardly. The inwardly turned flange 335 mounts a fourth or rear housing piece 311 via a forward, outwardly extending flange 336 using suitable fasteners (not shown). The third housing piece 310 is provided with a stop positioner mounting aperture 337 which receives portions of a stop positioner 338. Stop positioner 338 is also received along a flat 339 formed along the upper side of the rear housing 311. A way 356 formed with aperture 337 receives a projection on the stop positioner to provide position engagement between such parts.

The rotor stop positioner includes a throw rod 340 which is slidably mounted within a stop positioner housing 341 using a pair of pistons 342 and 343. Pistons 342 and 343 are provided with circumferential seals 344 and 345, respectively, to seal against the preferably cylindrical interior walls of the housing 341. The forward end of throw rod 340 is provided with an engagement roller 346 which is rotatably mounted within a forward end yoke 347 formed in the forward end of throw rod 340. The engagement roller 346 is positioned and oriented to extend forwardly in a longitudinal direction to engage the rearward face of a stop positioner disk 348 mounted for rotation upon the outer shaft 302. The rearward face of disk 348 includes a depression which is engaged by roller 346 to lock the rotating assembly in a desired upright position as shown in the Figs.

Roller 346 is extended into engagement with disk 348 by controllably supplying pressurized fluid behind piston 343 through pressure port 350. Port 350 extends through the sidewall of housing 341. Housing 341 is also provided with a retraction pressure supply port 352 in front of piston 343 for controlled pressurized retraction of engagement roller 346. Port 349 is formed in a rear end piece 351 threadably mounted in the rear end of housing 341. Port 349 allows relatively rapid retraction of the throw rod in response to pressure applied through port 352. Extension of the throw rod is softened by the confined chamber 357 in front of piston 342 from which gas can only escape through the restrictive orifice 358. This prevents destructive hammering of disk 348 by roller 346.

The shaft assembly 300 includes a plurality of components which allow rotation of the entire assembly about the longitudinal rotational axis X—X, while providing the additional capability of controlled axial extension of some shaft assembly parts when the assembly is at rest rotationally. The shaft assembly includes an outer shaft 302 which is a primary structural member of the assembly. Outer shaft 302 is supported by the rotatable inner races of ball bearings 304 and 305. The stationary outer races of bearings 304-5 are supported by the first and second housing pieces 308 and 309, respectively. The outer shaft also is coupled to the driven ring 360 of motor 106 to controllably apply torque from the motor to the shaft to rotate the rotating assembly.

Motor 106 is preferably a brushless DC electrical motor. Brushless DC motors are sometimes alternatively referred to as permanent magnet synchronous motors. This type of electrical motor includes a rotor having permanent magnets mounted thereon. The stator typically includes a plurality of windings which are pulsed with electrical current to induce a magnetic field which interacts with the permanent magnets on the rotor and causes the rotor to rotate. In order to simplify the presentation of FIG. 9 the magnets and windings of motor 106 have been omitted. The absence of electromagnet windings on the motor's rotor assembly eliminates the need for brushes or similar sliding connectors which generate dust particles. The stator windings of the brushless DC motor are supplied with current using a brushless DC motor controller 144 which is advantageously mounted in the base of cabinet 21 as shown in FIG. 3.

The motor controller 144 is an electronic device which is used to commutate and properly time the current supplied to each stator winding. A variety of commercial designs are potentially useful. The position of the rotor must be accurately determined to provide proper coordination between the electromagnetic fields developed by the stator windings and the permanent magnets of the rotor. The brushless DC motor controller typically utilizes a transistorized array which switches current to the stator windings at appropriate intervals and at appropriate polarities to produce maximum torque on the rotor. When the rotor is turning but no longer being driven, then the motor acts as generator due to the movement of the permanent rotor magnets past the stator windings. The continuing rotation of the motor's permanent magnets induce currents in the stator windings which are dissipated through a brake resistor forming a part of the motor controller. Alternatively, the stator windings can be appropriately provided with current to produce electromagnetic forces which oppose rotor rotation in a process referred to as dynamic braking. Dynamic braking provides very effective braking of the motor rotor speed to provide fast stopping.

A preferred brushless DC motor 106 used in the novel processors of this invention is a 3-phase motor although others are alternatively possible. This motor is designed to operate on standard 3-phase, 60 Hz AC power, such as that having approximately 208 volts nominal voltage differential between the conductors of the 3-phase power. The motor is either provided with suitable optical or other motor rotor position detectors 326, or such must be otherwise adapted for suitable controller operation of the motor. Suitable motor controllers are commercially available. The motor controller is preferably provided with a relatively high wattage brake resistor, such as approximately 55 watts and 50 ohms, which is controllably connected by the motor controller to function as a load to the current generated during stopping of the motor. This allows for high stator currents to be developed and high stopping torque performance. The brushless DC motor also allows for easy control of the motor speed for varying desired processing speeds by suitable variation of the voltage supplied to a motor speed control input on the motor controller 144.

A second shaft 362 is mounted within outer shaft 302 in a coaxial relationship thereto. The second shaft is adapted to extend axially and is connected to hub 421 of the extension subassembly of rotor head 400 to controllably extend and retract that subassembly. The frontward end of second shaft 362 is provided with a shaft head 363. The forward end of shaft head 363 fits within a shaft receptacle 424 formed in the rearward face of hub 421. Receptacle 424 and the forward end of the shaft head are preferably sized to produce a mechanically strong interference fit between these parts. Shaft head 362 is also provided with an exterior tapered section 364 which converges rearwardly. The exterior tapered section is received within a corresponding rearwardly converging interior tapered section 365 formed along interior surfaces at the forward end of outer shaft 302. The tapered sections 364 and 365 engage when the second shaft is retracted into the fully retracted position shown in FIGS. 9 and 10. When the second shaft is axially extended the tapered sections are disengaged. Engagement between the tapers provides positive coaxial positioning of the retracted second shaft thus allowing for high speed rotation without substantial fluctuations in weight distribution which might otherwise cause imbalance problems.

The front end of second shaft 362 is supported during axial extension by an annular piston 366. Piston 366 is located in a fixed longitudinal position near the forward end of a third shaft 367. The forward face of piston 366 is axially restrained by a snap ring 368 which fits in a circumferential groove formed in third shaft 367. A small shoulder formed on the outer surface of shaft 367 restraints the rearward face of piston 366. The piston 366 is provided with interior and exterior seals which seal against the interior of second shaft 362 and the exterior of shaft 367, respectively. The interior cylindrical bore of shaft 362 slides relative to piston 366 during axial extension and retraction of the second shaft.

In axially extended positions the forward end of second shaft 362 is also supported by a fastening spacer ring 369. Fastening spacer ring 369 is connected to a fifth shaft 375 which also extends axially with the second shaft and spacer ring 369. Spacer ring 369 is advantageously threaded about the exterior periphery for threaded connection within the forward interior section of the second shaft head 363. Similarly, the interior hole of the spacer ring is advantageously threaded to allow threaded connection with the forward end threaded section of fifth shaft 375. The forward face of ring spacer 369 is provided with spanner wrench receptacles 370 for engagement with a spanner type wrench for tightening and loosening the threaded connections just described. The rearward periphery of ring spacer 369 is advantageously provided with a seal against the bore of second shaft 362.

The rearward end of second shaft 362 is provided with a sleeve-shaped combined piston and spacer 372. The piston spacer sleeve 372 has a rearward enlarged section or piston head which bears upon the rearward end face of the second shaft 362 and applies force from pressurized fluid within chamber 444 to extend the axially extendible portions of the shaft assembly. The piston spacer sleeve 372 is connected to the rearward end of the second shaft along its interior bore by a tight or interference fit between such parts. The interior bore of spacer sleeve 372 is advantageously fitted with a slide bushing 373 which facilitates axial sliding motion of the piston spacer sleeve along the third shaft 367. The piston head portion is provided with inner and outer seals which seal against the interior bore of second shaft 362 and the outer diameter of third shaft 367, respectively.

The forward end of the third shaft 367 is provided with an end piece 377 which has a flange which bears upon the forward end of the third shaft. The end piece is securely fixed to the end of the third shaft by a tight or interference fit therebetween. The interior passage of end piece 377 is a shaped to receive a splined outer surface formed along substantially the entire length of the fifth shaft 375. The end piece thus functions as an anti-rotation guide sleeve for the fifth shaft which prevents relative rotation of the fifth shaft relative to the third shaft. During centrifugal processing all components of the shaft assembly rotate about axis X—X. However, when the rotation assembly is stopped, it is necessary to maintain the desired upright positioning of the extendible subassembly of the rotor. The splined guide connection described above serves this function.

End piece 377 also has a rearward exterior diameter which is sized to receive the forward end of fourth shaft or tube 374. The rearward end of the tubular fourth shaft 374 is sealed using a sealing sleeve 386 which is positioned within the interior bore of both third shaft 367 and fourth shaft 374. The outer periphery of sealing sleeve 386 includes a circumferential seal with the bore of third shaft 367. Fourth shaft 374 serves to define an annular space about its exterior and within the interior bore of third shaft 367. The ends of this annular space are defined by end piece 377 in the front and sealing sleeve 386 in the back. The annular space is used to communicate pressurized fluid therethrough using rear port 387 and front port 388 formed through the wall of the third shaft 367. This set of fluid passageways allows pressure to be controlled within an annular retraction chamber 389 defined between the interior of second shaft 362 and the exterior of third shaft 367. The ends of the retraction chamber are defined by annular pistons 366 and 372.

The rearward end of the third shaft 367 is spaced relative to outer shaft 302 using a spacer piece 378. Spacer piece 378 has a sleeve portion which fits between the bore of outer shaft 302 and the outside of third shaft 367. The relative angular and axial positions of outer shaft 302, third shaft 367 and spacer piece 378 are maintained by radial fasteners 380. Spacer piece 378 also has a rearward flange 379 which also serves in forming a tight connection between the outer and third shafts. Flange 379 has an interior counterbore 381 formed along the interior rearward face. Counterbore 381 receives a snap ring which is installed at the frontward extreme of the counterbore within a groove formed in shaft 367 to axially locate the shaft and spacer piece. Counterbore 381 also receives two coacting wedge rings 382 and 383. The heel of wedge ring 382 is forced forwardly by a tightening ring 384. Tightening ring 384 is forced forwardly by a set of four equiangularly spaced fasteners 385 which extend through counterbored holes in the tightening ring and are received in threaded holes formed in flange 379. Tightening fasteners 385 force the wedge ring 382 in an axial direction which causes the coacting wedges to expand radially to form a tight coaxial connection between the spacer piece and third shaft 367.

Spacer piece 378 also serves as a pressurized fluid distribution sleeve to distribute pressurized actuating fluids used to extend and retract the axially movable portions of the shaft assembly. Pressurized actuating fluid is supplied to the shaft assembly fluid distribution sleeve using a pressurized fluid supply 430. Pressure supply 430 is controllably extendable and retractable in a radial orientation to allow controlled coupling to the shaft assembly during rotationally stopped periods, and decoupling of the pressure supply from the shaft assembly during periods the shaft assembly is rotating.

Pressure supply 430 includes a pressure supply housing 431 which is suitably connected to housing piece 311 at a pressure supply port 432. Housing 431 advantageously includes an inner piece 433 and outer piece 434.

Extending between pieces 433-4 is a reciprocation barrel advantageously in the form of a piston receiving cylinder 435. A pressure supply extension-retraction piston 436 is slidably mounted within cylinder 435 and is used to movably position the pressurized fluid supply conduits 437 and 438. Conduits 437-8 are also mounted by inserts forming detachable parts of the inner and outer pieces 433-4. Pressure is supplied to opposing sides of piston 436 to extend or retract the pressure conduits into fluid communication with ports 439 and 440 formed through the wall of the outer shaft 302 at appropriate positions when the shaft is stopped in the upright position by the rotor stop positioner 338. Port 439 communicates fluid with a circumferential groove 441 and associated passageway 443. Passageway 443 communicates fluid with shaft extension chamber 444 defined between the inside of outer shaft 302, the outside of third shaft 367, rearward of piston sleeve 372, and forward of spacer piece 378. Pressure developed within extension chamber 444 causes the second and fifth shafts to extend forwardly and carry the wafer support extension subassembly of the rotor head outwardly from the processing chamber for loading or unloading.

Conduit 438 communicates with pressure port 440 and circumferential groove 442 on the gas distributing spacer ring 378. Groove 442 communicates fluid through a passageway 445 to port 387 in the third shaft 367. Pressure communicated through port 387 reaches the retraction chamber 389 via front port 388 in the third shaft. Pressure applied to retraction chamber 389 retracts the axially movable portions of the shaft assembly after loading or unloading has been completed. Three spaced circumferential seals are provided along both the inside and outside of the gas distributing spacer ring 378 to seal and confine spaces being supplied with pressurized fluids which are independently operated.

The fifth shaft 375 extends rearwardly at the center of the shaft assembly along the rotational axis and is controllably engaged by an axial locking means 450. The axial locking means secures the extendible shaft assembly components and connected extension subassembly of the rotor head in the retracted position. This is advantageously accomplished by providing a controlled detent mechanism which secures the axial position of the axially movable components. The axial locking mechanism is needed because the rotating assembly is rotated at relatively high angular speeds during rotation, thus the axially movable components should be properly positioned and secured both axially and radially to assure dynamic balancing and smooth operation. The complementary tapered sections 364 and 365 between the outside and second shafts radially align the axially movable shafts when retraction chamber 389 is pressurized. However, when the pressure supply 430 is retracted no pressure is available to secure the extendible shaft components in the desired retracted position during rotation. Axial locking means 450 provides axial mechanical restraint during rotation of the processor rotating assembly.

Locking means 450 includes a first locking piece spool 451. Forward portions of the first locking piece spool 451 are received within the rearward end of the third shaft 367, preferably in a close or interference fit therewith. The coacting ring wedges 382-3 also develop radial contraction forces within the third shaft to further secure spool 451 within the interior bore of the third shaft. First locking piece spool 451 also includes an enlarged rearward flange 452. The rearward end of spool 451 is provided with a receptacle 453. Receptacle 453 receives a flanged head of second locking piece 454. The flanged head of piece 454 is held within receptacle 453 using a detachable internal snap ring 455. The rearwardmost internal shoulder formed in receptacle 453 engages the forward end of an axial lock biasing spring 456.

The second locking piece 454 extends rearwardly from the front flange to form a cylindrical sleeve portion. The cylindrical outer surfaces of the sleeve portion slidably mount a third locking piece 458. Third lock piece 458 has a forwardly directed shoulder upon which the rear end of spring 456 bears. Spring 456 yieldably forces the third lock piece rearwardly. The rearward portions of piece 458 extend from the shoulder backward to an annular end face. The annular end face is controllably contacted by a lock release actuator 460 which slides the third lock piece 458 forward against the counteracting force of biasing spring 456.

The interior of third lock piece 458 includes a beveled inwardly and rearwardly facing surface 461. One or more locking elements preferably in the form of locking balls 462 are captured within locking ball openings formed in the rearward portions of the second lock piece 454. The force of biasing spring 456 is transmitted through the third lock piece 458 and against the balls 462. The beveled surface 461 forces balls 462 inwardly to engage a tapered groove 463. Groove 463 is formed circumferentially about rearward portions of a fifth shaft locking extension 464. Extension piece 464 is threaded into a receptacle 465 formed in the rear end of fifth shaft 375. Force is transmitted from spring 456 through balls 462 and against the shaft extension 464 to secure the axially movable components into a retracted position as shown in FIGS. 9-11.

The locking release actuator 460 includes a piston 467 which is slidable within a rearward interior bore formed within housing piece 311. Piston 467 is biased rearwardly into a retracted position by a series of piston biasing springs 468. The preferred embodiment uses four equiangularly positioned springs 468. The front of springs 468 bear upon an internal flange formed within housing 311. The rear of springs 468 are received within receptacles 469 formed in the face of piston 467. Two circumferential seals extend along the sidewalls of piston 467.

Piston 467 is actuated into a release position by supplying pressurized fluid between the rear face of the piston and a rear housing end piece 470 via pressure port 471. Rear housing end piece 470 is threadably secured into the interior of housing 311. A peripheral seal is advantageously used to seal between the end piece 470 and housing 311 forward of the threaded connection to maintain gas pressure in the enclosed locking release actuator pressure chamber 472. A receptacle 473 is advantageously provided to allow recessed positioning of a fitting (not shown) which is connected to port 471. Spanner wrench holes 474 are provided to facilitate torquing the end piece.

FIG. 14 indicates that the processing chamber 113 is provided with appropriate components for introducing a rinsing spray of water or other processing fluid onto the wafers or other units being processed. The spray system includes a spray head 190 which advantageously includes a linear array of closely spaced spray nozzles 191 which extend through a spray head opening 195 in the side wall of the processing enclosure. Approximately 8-10 nozzles per foot of chamber length has been found advantageous. The spray head extends substantially along the length of the chamber or to a sufficient extent to provide spray coverage to both sides of all wafers being processed. The nozzles are preferably a high fluid flow rate, low pressure nozzle. This increases the rinsing action with a minimum or splatter and reflected spray within the processing chamber, thus reducing undesired small droplet formation on the surface of the wafers. The nozzles preferably have an approximately 80° inclusive spray angle to achieve a spray pattern which covers the wafers 18. The pressure is advantageously within the range of 15-30 psi gauge, more preferably approximately 25 psig. The nozzles are suitably mounted to a spray head assembly unit 192 which is detachably mounted to the exterior surfaces of the processing enclosure sidewall 110 using fasteners 193 (see FIG. 6) and studs 194 welded to the exterior surface of wall 110.

The spray head 190 is supplied with a suitable fluid, such as deionized water or other processing fluid. FIG. 16 indicates that deionized water is supplied, such as from the building or other production facility plumbing system. The deionized water or other processing fluid is coveyed through suitable tubing or other conduits 220 to two process fluid control valves 221 and 222. The first control valve 221 controls the flow of process fluid to the spray head 190. The second valve 222 is used to recycle a small flow of deionized water when valve 221 is closed, thereby preventing bacterial propagation in stagnant water lines. The outflow from valve 222 is passed through a variable restriction valve 225 mounted in the deionized water recycle return or outflow conduits 226.

Adjacent to and connected with the process fluid control valve 221 is a process fluid purge valve 223. The process fluid purge valve 223 controllably directs a flow of nitrogen or other purging gas through valve 221, the connecting water supply conduits 224, and spray head 190, to thereby purge the water from the spray system. Nitrogen is supplied to valve 223 via line 239. This purge function reduces drying time by causing the water to drain from the process bowl rather than being present in conduits connected to the processing chamber while the chamber is being purged with heated nitrogen to dry the wafers or other products being processed.

FIG. 16 further shows the processing enclosure 100 and processing chamber 113 schematically. The processing fluid, such as deionized rinse water, is sprayed from spray head 190 as controlled by valve 221. After passing over the wafers 18, the spent rinse water or other fluid drains to a drain panel 197 integrally formed by the sidewall 110. The rear wall 111 of the process chamber is provided with a drain aperture 198 which serves as the drain for the processing enclosure. The drain 198 is connected by a drain line 199. Drain line 199 can be plumbed directly to an acceptable facilities drain, or through a drain box 82 of suitable design or as described hereinabove.

FIG. 16 also shows the desired nitrogen system used in the rinser-dryer processor 20. Nitrogen gas is supplied from any suitable source. The desired source supplies nitrogen in the pressure range of approximately less than 40 psig. more preferably 30-40 psig. The source is connected to the nitrogen inlet fitting 80 which is connected to nitrogen supply line 230. The nitrogen supply line is preferably provided with a primary filter 231 which is used to remove contaminants which may be present in the flow of nitrogen or other suitable drying and or purging gas. The gas from filter 231 is conveyed to two nitrogen flow control valves 233 and 234. The first nitrogen control valve 233 controls the flow of large quantities of nitrogen gas to the processing chamber for drying purposes. The second nitrogen control valve 234 controls a small flow volume for purposes of maintaining a small nitrogen purge on the processing chamber during remaining portions of the processing cycle and at other times as desired to prevent migration of particulate contaminants into the chamber. It is preferred that the nitrogen purge controlled by valve 234 be operative whenever the power switch 61 is on. The flow of nitrogen or other drying gas through line 239 to the processing chamber is preferably further cleaned by passing it through a secondary filter 235. In the preferred embodiment employing both filters 231 and 235, the first filter is advantageously provided with an approximate pore size of 1 micron, and the second filter is provided with an approximate pore size of 0.1-0.2 microns. This is significant in reducing or preventing introduction of additional contaminant particles into the processing chamber.

The nitrogen or other drying gas from filter 235 is conveyed through lines 239 to the processing chamber through a drying gas infeed 236. The drying gas infeed is advantageously adapted to also function as a drying gas heating vessel. The rearward end of the infeed is preferably threaded to receive the head of an electric resistance heater 237 (see FIG. 6). The drying gas heating system is provided with an over-temperature detector and switch 238 which controls the flow of electrical current to prevent heating when the temperature in the heater reaches a preset maximum, such as in the range 140°-200° F., most preferably approximately 160° F. The processing enclosure 100 is provided with suitable openings to allow the heated nitrogen or other drying gas to enter into the processing chamber, preferably at locations near the top of the chamber and adjacent the window and rear wall. The drying gas enters through nozzles which are sized to create a pressure in the infeed chamber (manifold) which is less than 40 psig, more preferably less than 20 psig, even more preferably 10-20 psig. most preferably approximately 18 psig. The jets of entering drying gas are advantageously directed upon the window and rear wall, or as otherwise is appropriate for the particular processing being accomplished. The drying gas infeed unit 236 is connected to the outer surface of sidewall 110 in the same manner as the rinse spray unit 192.

FIG. 16 indicates that nitrogen or other suitable gas from filter 231 is also conveyed to a suitable pressure switch 240 which serves to limit or stop operation of the processor 20 if the supply of nitrogen should become insufficient. A second pressure switch 241 is also provided downstream of valves 233 and 234 for pressure monitoring and operational control purposes to assure adequate flow of drying nitrogen during the drying cycles.

The nitrogen from filter 231 is also advantageously used as a control media in processor 20. The branch line 243 supplies nitrogen or other suitable control gas to a pneumatic control distribution manifold 245. The manifold supplies nitrogen to a plurality of electrical solenoid controlled valves 210-219. The solenoid valves 210-219 supply nitrogen to other components of the processor which are adapted to be controlled by nitrogen flow. Specifically, solenoid valve 210 controls the operation of drying nitrogen supply valve 233; solenoid valve 211 controls the operation of rinse water valve 221 and associated recycle control valve 222; solenoid valve 212 controls operation of low flow nitrogen supply valve 234; solenoid valve 213 controls the flow of purge gas through the rinse spray system purge valve 223; solenoid valve 214 controls the operation of the stop positioner 338; solenoid valve 215 controls the expansion of the inflatable door seal 50; solenoid valve 216 controls the axial lock release 460; solenoid valve 217 controls the extensions and retraction of the pressure supply 430; solenoid valve 218 controls application of extension pressure through conduit 437; solenoid valve 219 controls application of extension pressure through conduit 438; and solenoid valve 477 controls application of pressure to the door operator 476 via valve 478.

FIGS. 17-20 show a preferred electrical system used in the processor 20. The electrical system includes a control system which is advantageously programmable to allow varied process parameters to be automatically accomplished. The main element of the control system is a main logic board or controller 200 which is programmable sequence controller. The controller 200 receives an input signal from the resistivity probe or sensor 85 which is advantageously mounted in the drain box 82 or at other suitable location downstream of processing bowl drain 198. The resistivity sensor 85 is used to indicate the degree to which processing chemicals having resistivities different from deionized water have been rinsed from the products. The resistivity sensor is connected by wire leads 251 to a detachable wire harness 252, which in turn is connected to the appropriate terminals of the main controller 200. The main controller processes the sensor resistivity signal from sensor 85 and produces signals used to drive a visual display on display board 254 which is on control panel 60 indicating the resistivity of the drain outflow. The display board also includes displays for angular speed of rotor, cycle step, and programming switches for imputing information to the controller as to desired cycle time settings, speed settings, and desired resistivity of outflow.

FIG. 17 also indicates that the start switch 66 and stop switch 68 are connected to the main controller to allow automatic cycle operation. After the operator has properly initiated the machine and closed the start switch the preprogrammed cycle will run. The switches 66, 68 are connected at the processor 200 both at their active terminal and to a common input 257.

FIG. 17 further shows that the processor 200 receives an indication that nitrogen pressure is adequate from the pressure switch 240. Insufficient pressure on switch 240 causes the controller to limit operation of the processor to a standby mode with a display indication that low nitrogen pressure exists. A bowl temperature switch 259 is also preferably included to prevent continued processing when the processing chamber is not operating at a minimum temperature. Also shown is the door safety switch 261 which is closed when the door is closed. The door safety switch prevents processor cycle operation unitl the door is closed. The door is held against entry by the door seal 50, or by using an optional latching mechanism (not shown). A flow sensor 265 is advantageously included in the incoming line of deionized water to assure adequate rinsing during operation. The switches 240, 259, 261, and 265 are connected to a common input bit connection 266 on the processor 200.

FIG. 18 shows some of the primary operational outputs from the main logic board of the system controller 200. Current is supplied to the controller 200 for its operation and the operation of the controlled solenoids, such as from the indicated 24 volt power source 268 shown in FIG. 19, and described in greater detail below. This voltage supply is used in driving a number of solenoids and related operational devices as shown FIG. 18. Included are the solenoids 210-219 and 477 controlling the flow of nitrogen to gas operated valves 233, 221, 22, 234, 223, 416-419, and 478 respectively; as well as to stop positioner actuator 338 and door seal 50.

. Also only indicated in FIG. 18 is an optional control valve solenoid 279 which can be added to processor 20. Solenoid 279 would be added to controllably supply nitrogen to a chemical process fluid control valve (not shown) but similar to rinse water control valve 221, except connected to control the flow of a suitable chemical processing fluid, such as a detergent, mild acid or other cleaning or processing fluid.

FIG. 19 shows that nominal 120 volt AC power is supplied through a power on-off switch 61. A power indication light 63 is used to indicate the power on condition. An appropriate fuse 269 is interposed in the conductor supplying the 120 volt AC power to the main controller 200, for example a 7 amp fuse. A second fuse 270 is interposed between the power switch 61 and an electromagnetic interference filter 271. Fuse 270 is preferably an 8 amp fuse. A suitable power supply 272 is included downstream of the filter 271. The power supply is preferably adapted to provide connections for logical ground, logical 5 volts DC, 24 volts DC, and 5 volt DC and ground for the light emitting diodes of display 254.

FIG. 19 also shows the connection of the brushless DC motor 106 and its controller 144. Motor 106 has associated shaft position sensor outputs which are connected to the motor controller 144. The controller is also connected to the fused 120 volt AC power, line neutral 274 and safety ground. This is advantageously done through a safety ground bus bar (not illustrated). The motor controller 144 receives signals output from the system controller 200 which allow control of motor on or off, signal 276; motor braking operation, signal 277; and motor reverse operation, signal 278. Motor controller ground is provided via conductor 280 to main controller 200 and motor 106. Speed control is effectuated by varying the voltage on conductor 281 which is communicated to both the controller 144 and motor 106. Conductor 282 additionally provides information from the controller for proper operation of motor controller 144. Three phase power is supplied from motor controller 144 to the stator windings of motor 106 via conductors 283-285. Terminal numbers are indicated within the schematic representation of motor controller 144 in FIG. 19.

FIG. 20 shows that 120 volt AC is supplied via system controller 200 to the drying gas heater 237 using a coupling capacitor 291. Pressure switch 241 and over-temperature switch 238 are connected in series with the heater 237 to preempt heating if either pressure falls below a predetermined minimum, or if the desired maximum temperature threshold is exceeded. FIG. 20 also indicates that the processor 20 is advantageously provided with a bowl heater 293 which is in contact with the processing enclosure, such as along the lower portions of side wall 110. The bowl heater is preferably an electric resistance heater. The power to heater 293 is supplied through coupling capacitor 295 and is controlled by system controller 200. An over-temperature switch 294 is in series with the heater 293 to prevent over-heating.

FIG. 20 also indicates that processor 20 is advantageously provided with an optional anti-static unit 297 which is also shown in FIGS. 5, 8 and 10. Anti-static unit 297 is provided with 120 volt AC power via coupling capacitor 296. Anti-static unit 297 has two electrodes 298 (FIG. 14) which extend into the processing chamber 113. The electrodes provide nominal positive and negative high voltages of approximately 5 kV.

Operation and Methods

In addition to the novel apparatuses described herein the invention also includes novel operational methods. The operation of processor 20 is initiated by turning power switch 61 on. The control panel 60 can then be manipulated to preprogram the desired operational method or methods desired. The preprogrammed information on processing can then be utilized automatically by the processor to achieve desired rinsing, drying or other processing times, temperatures and angular rotor speeds. Temperatures are typically preset at the factory but alternatively can be made programmable. Processing time can also be programmed to variable parameters, such as the resistivity of drain water, to thereby help assure consistent product processing quality. A default processing sequence is provided in the controller 200 memory which applies if programmed sequences are erased. The controller is provided with erasable programmable read only memory to maintain programming even though power is discontinued. The rinser-dryer processor 20 is advantageously provided with a 5 step programmable operational sequence in the processing or run mode. Alternative processing equipment constructed in accordance with this invention can have more, fewer, or variable numbers of processing steps as the system controller design provides.

After a suitable processing sequence has been programmed into the automatic controller 200, the control panel is activated to place the processor into a run mode of operation. Door 40 is then opened to allow loading of the processor. The rotor head extension assembly is then extended to allow robotic loading of the wafers, or similar processed unit.

Figure 13:
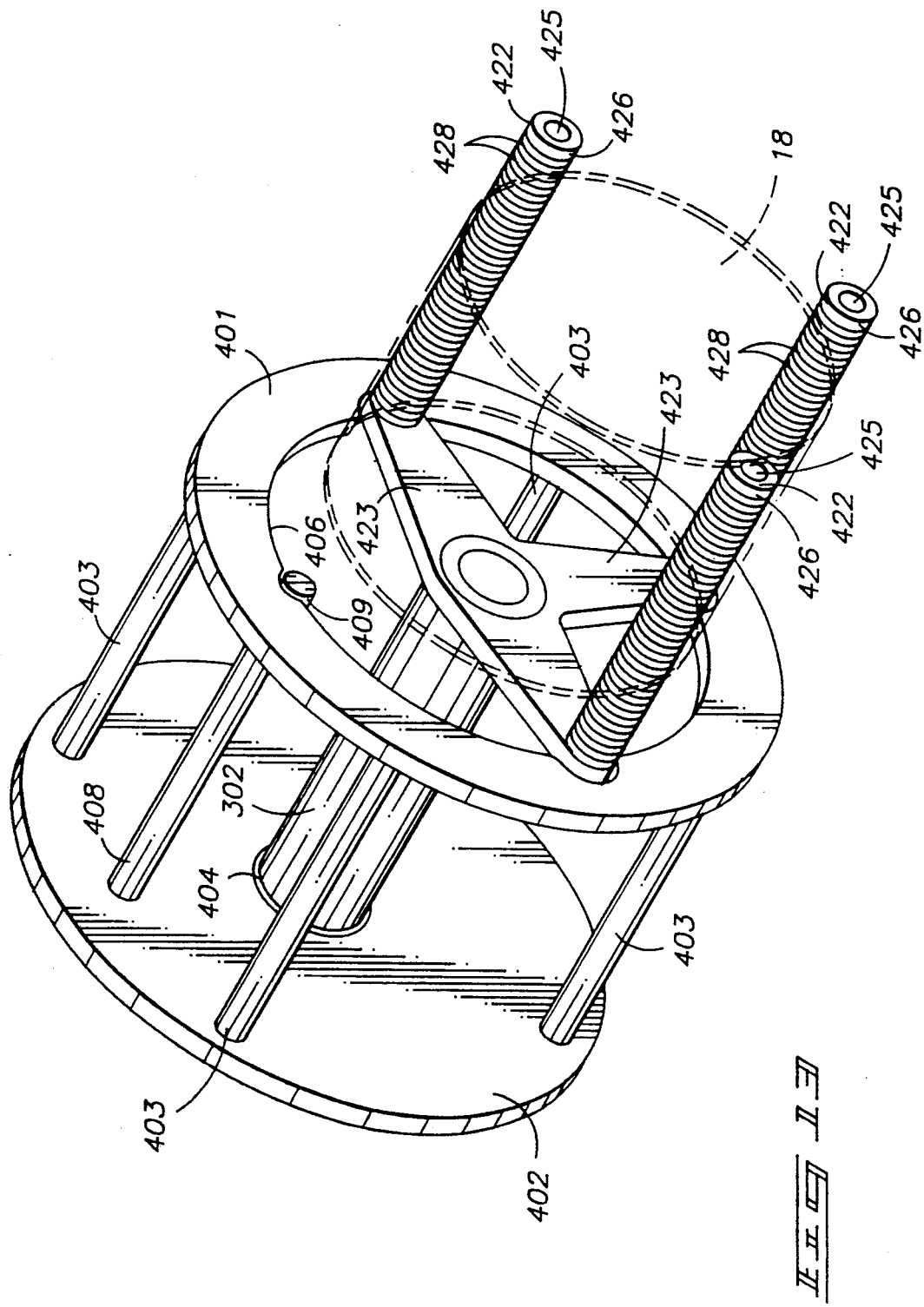
FIG. 13 is a perspective view showing isolated portions of the processor of FIG. 1 with the wafer support in an extended position.

The rotor head extension subassembly is extended by activating the axial locking mechanism release by pressurizing behind piston 467 to release third lock piece from its engagement with balls 462. The pressure supply is in an extended position and pressurized gas is supplied through conduit 437 to extension chamber 444 to force the second and fifth shafts and attached rotor head extension assembly into an extended position as shown in FIG. 13. The individual wafers are then loaded onto the unit supports 422, such as by utilizing a robotic handling system (not shown). The wafers can be discretely loaded, or more preferably, loaded all at the same time. The edges of wafers 18 are received within the grooves 428.

Once the wafer or wafers have been loaded onto the support members 422, then the rotor head extension subassembly can be retracted in preparation for processing. This is done by releasing pressure from chamber 444 and supplying pressure through conduit 438 to the contraction chamber 389. The pressure in chamber 389 forces the second and fifth shafts rearwardly into the retracted position shown in FIG. 12 and elsewhere.

After the axially movable assembly has been retracted, the axial locking mechanism is activated by releasing the pressure from piston 467. This causes the third locking piece 458 to force balls 462 into a detent engagement with groove 463 formed in the extension piece 464 rigidly connected to the fifth and innermost shaft 375. After the shafts have been axially locked then pressure is released from the contraction chamber 389 and the pressure supply is retracted by pressurizing above piston 436, as shown in FIG. 11. The rotor stop positioner 338 is also released by applying pressure through port 352 to the forward face of piston 343. The rotating assembly is thus freed for rotation. The door is also closed during preparation of the rotating assembly for rotation.

Controller 200 thereafter initiates operation by angularly accelerating the rotor in a rapid manner in order to minimize total processing time. Typical rinse or first angular speeds are greater than 200 revolutions per minute (rpm), preferably 200-1,000 rpm, more preferably 400-800 rpm, even more preferably approximately 600 rpm. Preferred angular acceleration rates are approximately in the range greater than 200 revolutions per minute per second (rpm per second), more typically 200-700 rpm per second, and more preferably approximately 250-700 rpm per second, or greater. The use of the brushless DC motor provides rapid acceleration which minimizes rotor acceleration times and decreases processing time. For example, rotor startup periods to 600 rpm are typically more than 100% greater with prior art brush-type AC motors.

Rotation of the rotor is advantageously accompanied by initiation of rinsing spray upon the product using jets of deionized water or other rinse liquid emanating from the rinse head 190. The control valve 233 is preferably done in a relatively gradual manner using the nitrogen operation of the valve to prevent water hammer in the fluid conveying lines. This rinsing proceeds for the desired preprogrammed amount of time, such as for 2-10 minutes. The controller also allows continuing rinsing based on the resistivity of the rinse effluent. This cycle is referred to as quality rinse and is variable in length dependent upon the sensed resistivity.

The third cycle in a preferred operational sequence for rinser-dryer 20 is the purge of rinse fluid. This cycle involves the opening of valve 223 which causes a substantial flow of nitrogen to occur through the water supply valve 221, downstream lines 224, and the rinse spray unit 192. This purges the rinse water or other processing fluid from the supply lines and reduces the risk of contamination from bacterial growth and water carryover into the drying cycle. A typical purge cycle lasts 5-30 seconds, more preferably 10-20 seconds.

Best results can be obtained when the rotor speed is increased during the final portions of the rinse cycle immediately prior to the purge and subsequent drying. For example, the rotor speed may be increased rapidly to approximately double or greater than the rinse speed, such as from 600 rpm to 1200 rpm, or greater, approximately 1-10 seconds prior to the start of the purging of rinse water or other processing fluid. The degree of acceleration is most preferably high during such speed increase to aid in the rapid removal of process fluids from the surface of the wafers. Angular acceleration rates in the approximate ranges indicated hereinabove for startup accelerations are also applicable to increases in rotor speeds desirable for centrifugal fluid removal at the end of the rinse cycle.

The removal of processing fluid from the product is accomplished at an angular fluid removal speed which is preferably greater than the rinsing or processing speed used during rinsing or other fluid processing. Fluid removal rotor speeds are greater than 800 rpm, preferably in the range 800–5,000 revolutions per minute (rpm), more preferably 1,000–4,000 rpm, even more preferably approximately 1,200–3,000 rpm. The increased rotor speed and acceleration during the period rinse or processing fluid is being removed has also been discovered by the inventors to be significant in reducing particle contamination. Angular acceleration rates in the approximate ranges indicated hereinabove for startup accelerations are also applicable to increases in rotor speeds desirable for spin fluid removal after the end of the rinse cycle.

When the rotor is accelerated prior to termination of the rinsing, the fluid removal speed is preferably carried over beyond the initial purge cycle and into the drying cycle or cycles used to prepare dried, processed wafers or other product. An initial high speed spin drying cycle (Dry 1 phase) is preferred and characterized by the removal of water or other processing fluid droplets. The processing chamber during this period is continuously subject to a significant flow of drying gas, such as heated nitrogen in the temperature range of approximately 140°–200° F., most preferably approximately 160° F. After the initial high speed spin drying cycle there is preferably a reduced speed spin drying cycle (Dry 2 phase) wherein the angular speed of the rotor and product are reduced to drying speed levels, such as the speeds indicated for the rinsing or other fluid processing cycle. Higher speeds can alternatively be maintained but serve little benefit in drying of product due to prior removal of processing fluid droplets during the initial drying cycle or phase. The total drying cycles typically are carried out for periods ranging from 2–10 minutes, more preferably 3–8 minutes.

The decelerations used to effectuate the change in rotor speeds during the fast dry to slow dry cycles, and to stop the machine are preferably carried out at a rapid deceleration rate, primarily to save time. It is not currently known whether such deceleration rates contribute to improved processing. The desired deceleration rates are approximately in the same range as the acceleration rates indicated hereinabove.

After the final drying cycle the system controller 200 automatically stops the rotor and the rotor positioner causes the rotor to stop in an up position as shown in FIG. 14. This is confirmed by the optical detector. The door is then released for opening by deflating the door seal. The controller then goes through an extension process as described above to extend the processed wafers for removal by a robotic wafer handling apparatus (not shown).

The apparatus according to this invention are made of materials of construction which are acceptable for the processing fluids being used, and which are suitable to maintain low particle contamination. The processing chambers can be made from stainless steel and plastics, most notably TEFLON fluorocarbon polymers, such as TEFLON PFA and the like. In general the parts are made of stainless steel to help reduce particle contamination. Valves and tubing are preferably made from fluorocarbon polymers as indicated. The cabinet is preferably made from polypropylene. Other suitable materials are alternatively possible.

The apparatus of this invention are made by using common metal and plastic working techniques to form the parts indicated. The various electronic parts are capable of construction from commercially available components suited to the indicated purposes.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A centrifugal processor for processing a plurality of wafer units, comprising:

a frame;

at least one processing enclosure for containing and enclosing at least portions of a processing chamber; said at least one processing enclosure being mounted upon the frame and having at least one access opening through which said wafer units can be loaded into and unloaded from the processing chamber;

at least one closure mounted for controlled motion to open and close the processing enclosure; said at least one closure being controllably movable between at least a closed position wherein a substantially enclosed processing chamber is provided, and at least one open position wherein said at least one access opening is substantially clear to allow ingress and egress of said wafer units into and from the processing chamber;

at least one rotor mounted for rotation relative to said frame; said at least one rotor having portions thereof within the processing chamber;

extendible unit support means mounted upon said at least one rotor for holding said wafer units upon said rotor; said extendible unit support means being mounted to said rotor to allow extension of at least portions of the extendible unit support means at least partially through said access opening when said closure is in an open position to allow said wafer units to be loaded onto the extendible unit support means, and to allow retraction of the unit support means and any wafer units supported thereon into the processing chamber for processing when the closure is in a closed position; said unit support means including means for holding said wafer units in spaced relationship thereon.

2. A processor according to claim 1 wherein said means for holding said wafer units in spaced relationship includes a plurality of wafer support members having wafer positioning recesses which receive edge surfaces of the wafers at desired locations.

3. A processor according to claim 1 wherein said means for holding said wafer units in spaced relationship includes a plurality of cantilevered wafer support members having wafer positioning recesses which receive edge surfaces of said wafer units at desired locations.

4. A processor according to claim 1 wherein said extendible unit support means includes at least two unit support members cantilevered to hold said wafer units thereon.

5. A processor according to claim 1 wherein said extendible unit support means includes at least two unit support members cantilevered to an extendible shaft mounted within an outer shaft which is mounted for rotation.

6. A processor according to claim 1 wherein the extendible unit support means includes at least one unit support actuator for extending and retracting portions of the extendible unit support means.

7. A processor according to claim 1 wherein the extendible unit support means includes at least one unit support actuator for extending and retracting portions of the extendible unit support means; said unit support actuator including at least an outer shaft mounted for rotation relative to the frame, and at least an inner shaft mounted within the outer shaft for axial extension and retraction relative to the outer shaft.

8. A processor according to claim 1 wherein the extendible unit support means includes at least one unit support actuator for extending and retracting portions of the extendible unit support means; said unit support actuator including at least an outer shaft mounted for rotation relative to the frame, and at least an inner shaft mounted within the outer shaft for axial extension and retraction relative to the outer shaft; said at least an inner shaft including anti-rotation means for preventing relative rotation between the at least an outer shaft and at least an inner shaft when the unit support actuator is extended from a retracted position.

9. A processor according to claim 1 wherein the extendible unit support means includes an unit support actuator for extending and retracting portions of the extendible unit support means; said unit support actuator including at least one fluid pressure actuator for extending or retracting portions of the extendible unit support means using fluid pressure.

* * * * *